US011264582B2

(12) United States Patent
Lin et al.

(10) Patent No.: US 11,264,582 B2
(45) Date of Patent: Mar. 1, 2022

(54) LIGHT EMITTING DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 138 days.

(21) Appl. No.: 16/290,938

(22) Filed: Mar. 3, 2019

(65) Prior Publication Data

US 2020/0280009 A1   Sep. 3, 2020

(51) Int. Cl.
| | |
|---|---|
| *H01L 51/50* | (2006.01) |
| *H01L 27/32* | (2006.01) |
| *H01L 51/56* | (2006.01) |
| *H01L 51/52* | (2006.01) |

(52) U.S. Cl.
CPC ........ *H01L 51/502* (2013.01); *H01L 27/3216* (2013.01); *H01L 27/3246* (2013.01); *H01L 51/56* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 2227/323* (2013.01); *H01L 2251/558* (2013.01)

(58) Field of Classification Search
CPC ..................................................... H01L 27/146
See application file for complete search history.

(56) References Cited

U.S. PATENT DOCUMENTS

| | | | |
|---|---|---|---|
| 2017/0221969 A1 | 8/2017 | Steckel | |
| 2017/0345881 A1* | 11/2017 | Kim | ..................... G09G 3/3208 |
| 2018/0013094 A1* | 1/2018 | Kim | ..................... H01L 51/5253 |
| 2018/0261783 A1 | 9/2018 | Yun | |
| 2018/0358417 A1* | 12/2018 | Hamada | .............. H01L 51/5072 |
| 2019/0206961 A1* | 7/2019 | Kim | ..................... G09G 3/3291 |
| 2019/0326542 A1* | 10/2019 | Yang | .................. H01L 27/3209 |
| 2019/0348625 A1* | 11/2019 | Mitsumori | .......... H01L 51/0088 |

* cited by examiner

*Primary Examiner* — Mounir S Amer
(74) *Attorney, Agent, or Firm* — Winston Hsu

(57) ABSTRACT

A light emitting device includes a first light emitting unit and a second light emitting unit. The first light emitting unit includes a first composite layer, and the first composite layer includes an organic light emitting layer. The second light emitting unit is adjacent to the first light emitting unit, the second light emitting unit includes a second composite layer, and the second composite layer includes a quantum dot light emitting layer. A thickness of the first composite layer is different from a thickness of the second composite layer.

17 Claims, 17 Drawing Sheets

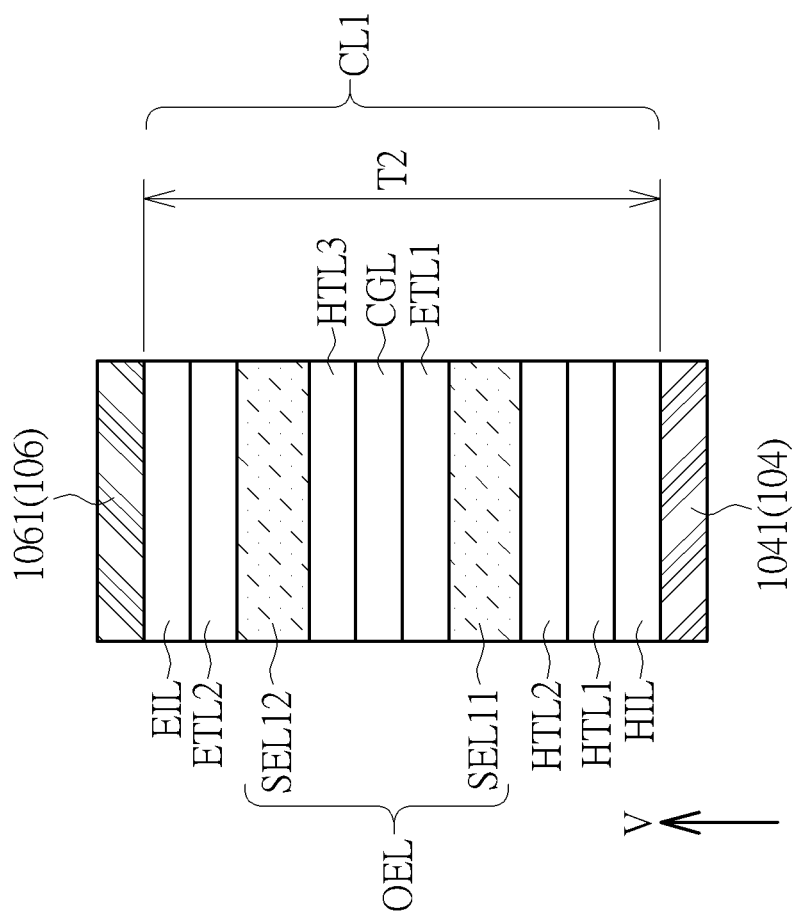
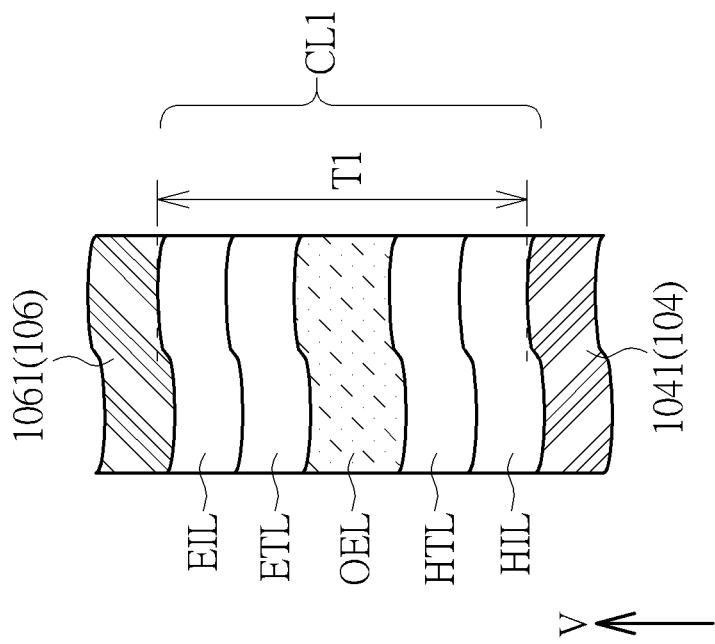

LIGHT EMITTING DEVICE

BACKGROUND OF THE DISCLOSURE

1. Field of the Disclosure

The present disclosure relates to a light emitting device, and more particularly to a hybrid light emitting device including a plurality of composite layers with different thicknesses.

2. Description of the Prior Art

In the conventional light emitting devices, the light emitting materials of different light emitting units may have different luminescence efficiencies or lifetimes, which may affect uniformity of illumination. Therefore, the present disclosure proposes a light emitting device that can reduce the above problem.

SUMMARY OF THE DISCLOSURE

In some embodiments, a light emitting device includes a first light emitting unit and a second light emitting unit. The first light emitting unit includes a first composite layer, and the first composite layer includes an organic light emitting layer. The second light emitting unit is adjacent to the first light emitting unit, the second light emitting unit includes a second composite layer, and the second composite layer includes a quantum dot light emitting layer. A thickness of the first composite layer is different from a thickness of the second composite layer.

In some embodiments, a light emitting device includes a first light emitting unit and a second light emitting unit. The first light emitting unit includes a first composite layer, and the first composite layer includes an organic light emitting layer. The second light emitting unit is adjacent to the first light emitting unit, the second light emitting unit includes a second composite layer, and the second composite layer includes a quantum dot light emitting layer. A thickness of the organic light emitting layer is different from a thickness of the quantum dot light emitting layer.

In some embodiments, a light emitting device includes a first light emitting unit and a second light emitting unit. The first light emitting unit includes a first composite layer, and the first composite layer includes an organic light emitting layer. The second light emitting unit is adjacent to the first light emitting unit, the second light emitting unit includes a second composite layer, and the second composite layer includes a quantum dot light emitting layer, wherein the organic light emitting layer and the quantum dot light emitting layer are manufactured in different processes.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 2 is a schematic diagram illustrating a cross-sectional view of a composite layer of a light emitting device according to a second embodiment.

FIG. 3 is a schematic diagram illustrating a cross-sectional view of a composite layer of a light emitting device according to a third embodiment.

DETAILED DESCRIPTION

The present disclosure may be understood by reference to the following detailed description, taken in conjunction with the drawings as described below. For purposes of illustrative clarity understood, various drawings of this disclosure show a portion of the lighting device, and certain elements in various drawings may not be drawn to scale. In addition, the number and/or dimension of elements shown in drawings are only illustrative and are not intended to limit the scope of the present disclosure.

Certain terms are used throughout the description and following claims to refer to particular components. As one skilled in the art will understand, lighting equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to".

When an element or layer is referred to as being "on", "disposed on" or "connected to" another element or layer, it can be directly disposed on or directly connected to the other element or layer, or intervening elements or layers may be presented. In contrast, when an element is referred to as being "directly disposed on" or "directly connected to" another element or layer, there are no intervening elements or layers presented.

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The technical features in different embodiments described in the following can be replaced, recombined or mixed with one another to constitute another embodiment without departing from the spirit of the present disclosure.

Figure 1:
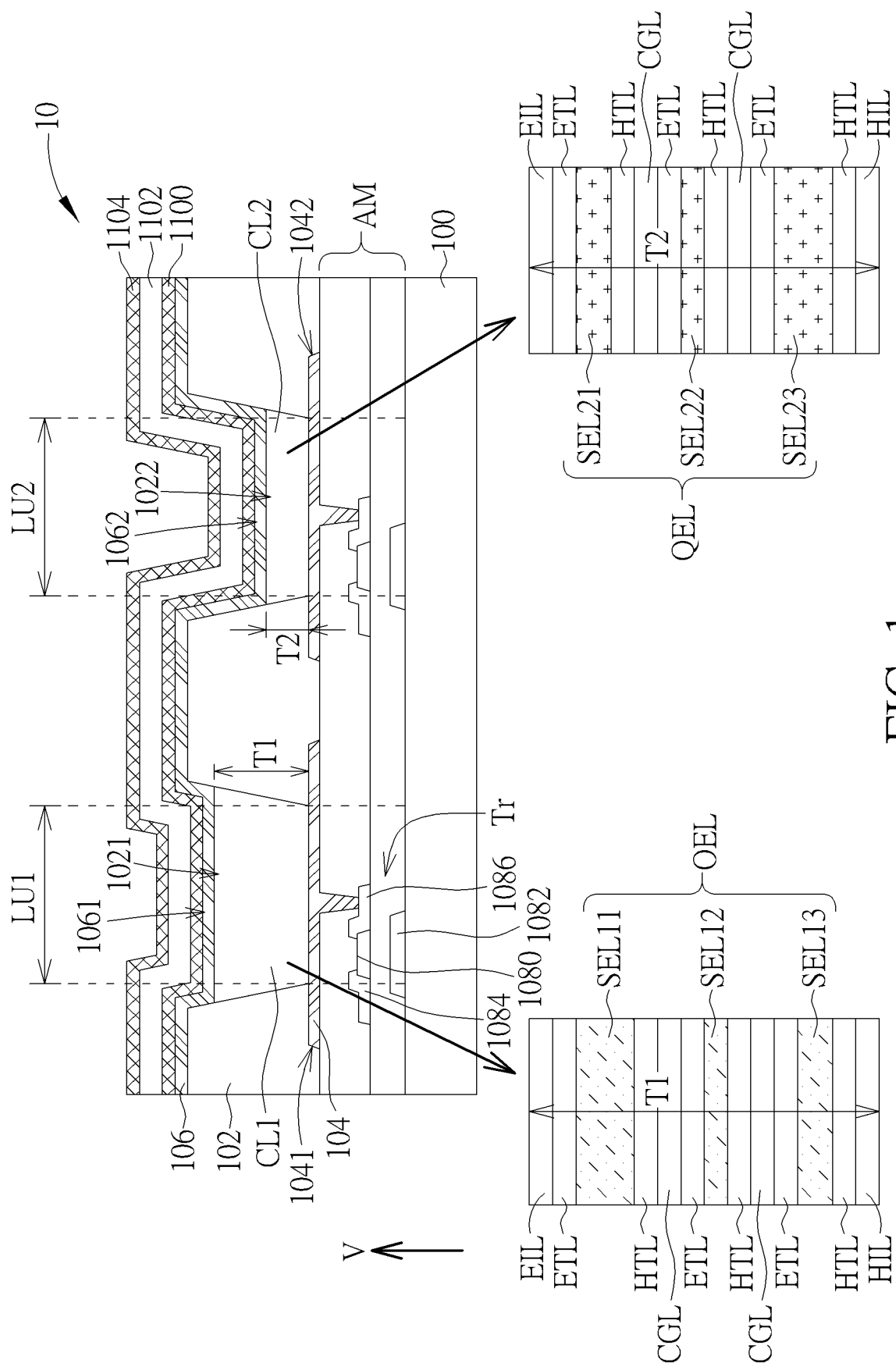
FIG. 1 is a schematic diagram illustrating a cross-sectional view of a light emitting device according to a first embodiment of the present disclosure.

Referring to FIG. 1, it is a schematic diagram illustrating a cross-sectional view of a light emitting device according to a first embodiment. In order to clearly present the characteristics of a light emitting device 10, FIG. 1 illustrates a portion of the light emitting device 10, such as a first light emitting unit LU1 and a second light emitting unit LU2. The light emitting device 10 may include a display device, an electronic device, a flexible device, a tiled device or other suitable devices, but it is not limited thereto. The light emitting device 10 may be a hybrid display device. For example, the light emitting device 10 may include at least two types of material, such as organic light emitting diodes (OLED), quantum dots LEDs (QLEDs or QD-LEDs), other suitable emitting materials or combination thereof, but it is not limited thereto. As shown in FIG. 1, the light emitting device 10 may include a first light emitting unit LU1 and a second light emitting unit LU2 adjacent to the first light emitting unit LU1, the first light emitting unit LU1 may include a first composite layer CL1, and the second light emitting unit LU2 may include a second composite layer CL2, but it is not limited thereto. In another aspect, the light emitting device 10 may include a substrate 100, an active matrix layer AM, a pixel defining layer (PDL) 102, and a plurality of composite layers (such as the first composite layer CL1 and the second composite layer CL2, but it is not limited thereto). The PDL 102 and the composite layers are disposed on the substrate 100, and the active matrix layer AM is disposed between the composite layers and the substrate 100. The substrate 100 may include glass substrate, a quartz substrate, a flexible substrate (such as plastic substrate) or other suitable substrates, but it is not limited thereto. The material of the substrate 100 may include a transparent materials or non-transparent materials. The material of the plastic substrate may include polyimide (PI), polycarbonate (PC), or polyethylene terephthalate (PET) or other suitable substrates, but it is not limited thereto. The PDL 102 may have a plurality of apertures, and one of the composite layers may be disposed in the corresponding aperture. As shown in FIG. 1, the first composite layer CL1 may be disposed in an aperture 1021, and the second composite layer CL2 may be disposed in another aperture 1022 adjacent to the aperture 1021, but it is not limited thereto. In some embodiments, one light emitting unit (such as the first light emitting unit LU1 or the second light emitting unit LU2) may include all elements (or layers) in a vertical region of one aperture. The material of the PDL 102 may include opaque insulating material, but it is not limited thereto.

As shown in FIG. 1, a thickness T1 of the first composite layer CL1 may be different from a thickness T2 of the second composite layer CL2. For example, the thickness T1 may be greater than the thickness T2, but it is not limited thereto. In some embodiments (not shown), the thickness T1 may be less than the thickness T2. The thickness T1 may be defined as a maximum thickness of the first composite layer CL1 in the normal direction V, and the detailed measurement manner will be described later.

As shown in FIG. 1, a ratio of the thickness T2 of the second composite layer CL2 to the thickness T1 of the first composite layer CL1 (T2/T1) may be greater than or equal to 0.1 and less than 1 ($0.1 \leq T2/T1 \leq 1$), but it is not limited thereto. In some embodiments, the ratio (T2/T1) may be greater than or equal to 0.3 and less than or equal to 0.9 ($0.32 \leq T2/T1 \leq 0.9$). In some embodiments, a ratio of the thickness T1 of the first composite layer CL1 to the thickness T2 of the second composite layer CL2 (T1/T2) may be greater than or equal to 0.1 and less than 1 ($0.1 \leq T1/T2 < 1$), but it is not limited thereto. In some embodiments, the ratio (T1/T2) may be greater than or equal to 0.3 and less than or equal to 0.9 ($0.3 \leq T1/T2 \leq 0.9$). In some embodiments, the thickness T1 of the first composite layer CL1 may be in a range from 100 nanometers (nm) to 200 nm ($100 \text{ nm} \leq T1 \leq 200 \text{ nm}$), but it is not limited thereto. In some embodiments, the thickness T1 of the first composite layer CL1 may be in a range from 130 nanometers (nm) to 180 nm ($130 \text{ nm} \leq T1 \leq 180 \text{ nm}$). In some embodiments, the thickness T2 of the second composite layer CL2 may be in a range from 20 nm to 100 nm ($20 \text{ nm} \leq T2 \leq 100 \text{ nm}$), but it is not limited thereto. In some embodiments, the thickness T2 may be in a range from 60 nm to 90 nm ($60 \text{ nm} \leq T2 \leq 90 \text{ nm}$).

In some embodiments, the light emitting device 10 may include at least two types of material, for example, the first composite layer CL1 may include an organic light emitting layer OEL, the second composite layer CL2 may include a quantum dot light emitting layer QEL, but it is not limited thereto. In some embodiment (FIG. 1), the organic light emitting layer OEL and/or the quantum dot light emitting layer QEL may include at least one sub-layer, but it is not limited thereto. In some embodiment (FIG. 1), the organic light emitting layer OEL and/or the quantum dot light emitting layer QEL may include a plurality of sub-layers having the same or different thicknesses, but it is not limited thereto. For example, as shown in FIG. 1, the organic light emitting layer OEL of the first composite layer CL1 may include a first sub-layer SEL11, a second sub-layer SEL12 and a third sub-layer SEL13, and the quantum dot light emitting layer QEL of the second composite layer CL2 may include a first sub-layer SEL21, a second sub-layer SEL22 and a third sub-layer SEL23, but it is not limited thereto. The number of the sub-layers of the organic light emitting layer OEL and/or the number of the sub-layers of the quantum dot light emitting layer QEL are an example, but it is not limited thereto. In some embodiment, the number of the sub-layers of the organic light emitting layer OEL may be the same as or different from the number of the sub-layers of the quantum dot light emitting layer QEL of the second composite layer CL2. In some embodiments, the first sub-layer SEL11, the second sub-layer SEL12, and the third sub-layer SEL13 may include organic light emitting materials. In some embodiments, the first sub-layer SEL21, the second sub-layer SEL22, and the third sub-layer SEL23 may include quantum dot light emitting materials, but it is not limited thereto. The organic light emitting materials may include NPD, mcp:Ir (used for emitting a light with red wavelength), CBP:Irppy (used for emitting a light with green wavelength), mcp:Firpic (used for emitting a light with blue wavelength), TPBi, or any combination thereof, but it is not limited thereto. The quantum dot light emitting materials may include core/shell structures. The cores may include $In_2S_3$, $Cu_2S$, $Ag_2S$, or any combination thereof, but it is not limited thereto. The shell may include ZnSe, ZnS, or the combination thereof, but it is not limited thereto. The thickness of one of the organic sub-layers of the first light emitting unit LU1 may be in a range from 10 nm to 200 nm (10 nm≤thickness≤200 nm), but it is not limited thereto. The thickness of one of the quantum dot sub-layers of the second light emitting unit LU2 may be in a range from 100 nm to 900 nm (100 nm≤thickness≤900 nm), but it is not limited thereto.

In some embodiments (FIG. 1), the second sub-layer may be disposed between the first sub-layer and the third sub-layer of the organic light emitting layer OEL (and/or the quantum dot light emitting layer QEL). In some embodiment, a thickness of the second sub-layer may be less than a thickness of the first sub-layer and/or a thickness of the third sub-layer, but it is not limited thereto. For example, as shown in FIG. 1, the second sub-layer SEL12 may be disposed between the first sub-layer SEL11 and the third sub-layer SEL13, and a thickness of the second sub-layer SEL12 may be less than a thickness of the first sub-layer SEL11 and/or a thickness of the third sub-layer SEL13. For example, as shown in FIG. 1, the second sub-layer SEL22 may be disposed between the first sub-layer SEL21 and the third sub-layer SEL23, and a thickness of the second sub-layer SEL22 may be less than a thickness of the first sub-layer SEL21 and/or a thickness of the third sub-layer SEL23.

The light emitting unit (e.g. the first light emitting unit LU1 or the second light emitting unit LU2) including multiple sub-layers (light emitting layers) can emit light having higher brightness or the lifetime can be increased, but it is not limited thereto. In some embodiments (FIG. 1), the thinner sub-layer (such as SEL12 or SEL22) disposed between thicker sub-layers (such as SEL11, SEL13, SEL21 or SEL23) can increase the recombination efficiency, or increase the lifetimes of the light emitting units. In other embodiments, the composite layer may include at least one sub-layer, and the thickness of the composite layers or the light emitting layers can be adjusted.

In some embodiments, the first composite layer CL1 (or the second composite layer CL2) may include a plurality of layers disposed between the corresponding anode and the corresponding cathode, and the details will be described later. For example, the first composite layer CL1 (and/or the second composite layer CL2) may include at least one hole injection layer HIL, at least one hole transporting layer HTL, at least one electron injection layer EIL, at least one electron transporting layer ETL, at least one charge generation layer CGL, and these layers may be disposed between the corresponding anode and the corresponding cathode, but it is not limited thereto. In some embodiments, the above layers of the first composite layer CL1 (and/or the second composite layer CL2) may be modified according to different demands. As shown in FIG. 1, the first composite layer CL1 (and/or the second composite layer CL2) may include a plurality of electron transporting layers ETL, a plurality of hole transporting layers HTL, a plurality of charge generation layers CGL, an electron injection layer EIL, and a hole injection layer HIL. In some embodiment (FIG. 1), the sub-layer (such as the first sub-layers SEL11, SEL21, the second sub-layers SEL12, SEL22, and/or the third sub-layers SEL13, SEL23) may be disposed between one electron transporting layer ETL and one hole transporting layer HTL, but it is not limited thereto. In some embodiments, one charge generation layer CGL may be disposed between two of the sub-layers, but it is not limited thereto. For example (FIG. 1), in the first composite layer CL1, the hole injection layer HIL, the hole transporting layer HTL, the third sub-layer SEL13, the electron transporting layers ETL, the charge generation layers CGL, the hole transporting layer HTL, the second sub-layer SEL12, the electron transporting layers ETL, the charge generation layers CGL, the hole transporting layer HTL, the first sub-layer SEL11, the electron transporting layers ETL, and the electron injection layer EIL may be disposed on the substrate 100 in sequence, and the third sub-layer SEL13 may be disposed between the substrate 100 and the second sub-layer SEL12, but it is not limited thereto. For example (FIG. 1), in the second composite layer CL2, the hole injection layer HIL, the hole transporting layer HTL, the third sub-layer SEL23, the electron transporting layers ETL, the charge generation layers CGL, the hole transporting layer HTL, the second sub-layer SEL22, the electron transporting layers ETL, the charge generation layers CGL, the hole transporting layer HTL, the first sub-layer SEL21, the electron transporting layers ETL, the electron injection layer EIL may be disposed on the substrate 100 in sequence, and the third sub-layer SEL23 may be disposed between the substrate 100 and the second sub-layer SEL22, but it is not limited thereto. The structure (such as the number or the stacking order of the layers) of the first composite layer CL1 (or the second composite layer CL2) is not limited to the above description.

The materials of the electron injection layers EIL may include LiF, Ca, Cs, or any combination thereof, but it is not limited thereto. The materials of the electron transporting layers ETL may include $IN_2S_3$, $n\text{-}Cu_2S$, $n\text{-}Ag_2S$, $n\text{-}ZnSe$, n-ZnS, n-ZnO, n-ZnTe, or any combination thereof, but it is not limited thereto. The materials of the hole injection layers HIL may include PEDOT:PASS, or any combination thereof, but it is not limited thereto. The materials of the hole transporting layers HTL may include PVK:TCTA, p-ZnSe, p-ZnS, p-ZnTe, or any combination thereof, but it is not limited thereto. In some embodiments, the thicknesses of the electron injection layer EIL, the electron transporting layer ETL, the hole injection layer HIL, and/or the hole transporting layers HTL may be in a range from 10 nm to 80 nm (10 nm≤thickness≤80 nm), but it is not limited thereto. In some embodiments, the thicknesses of the electron injection layer EIL, the electron transporting layer ETL, the hole injection layer HIL, and/or the hole transporting layers HTL may be in a range from 40 nm to 80 nm (40 nm≤thickness≤80 nm). The materials of the charge generation layers CGL may include MADN, BCP, NPB:$MoO_3$, NPD, or any combination thereof, but it is not limited thereto. In some embodiments, the thickness of the charge generation layer CGL may be in a range 5 nm to 100 nm (5 nm≤thickness≤100 nm), but it is not limited thereto. In some embodiments, the thickness of the charge generation layer CGL may be in a range 20 nm to 80 nm (20 nm≤thickness≤80 nm), but it is not limited thereto.

In some embodiments (FIG. 1), the light emitting device 10 may include a plurality of anodes 104 and a cathode 106. The anodes 104 may be disposed on or be electrically connected to the active matrix layer AM, and the first composite layer CL1 and the second composite layer CL2 may be disposed between the anodes 104 and the cathode 106. In some embodiments, one of the anodes 104 may be disposed corresponding to one of the light emitting units (e.g. the first light emitting unit LU1 or the second light emitting unit LU2), and the cathode 106 may be disposed corresponding to at least one of the light emitting units, but it is not limited thereto. For example, the first light emitting unit LU1 may include a first anode 1041 and a first cathode 1061 respectively electrically connected to the first composite layer CL1, and the second light emitting unit LU2 may include a second anode 1042 and a second cathode 1062 respectively electrically connected to the second composite layer CL2. In some embodiments (FIG. 1), the first anode 1041 and the second anode 1042 may be manufactured in a same process (such as coating processes and/or patterning processes, but not limited thereto). The material of the first anode 1041 or the second anode 1042 may include metallic material, transparent conductive material, or any combination thereof, but it is not limited thereto. The material of the first anode 1041 or the second anode 1042 may include Al, Ag, ZnO, ZnS, ITO, IZO or any combination thereof, but it is not limited thereto. In some embodiments, the cathode 106 may be a common cathode, the first cathode 1061 and the second cathode 1062 may respectively be a portion of the common cathode, but it is not limited thereto. In some embodiments (FIG. 1), the first cathode 1061 and the second cathode 1062 may be manufactured in a same process (such as coating processes and/or patterning processes), but it is not limited thereto. The material of the first cathode 1061 or the second cathode 1062 may include metallic material, transparent conductive material, or any combination thereof, but it is not limited thereto. For example, the light emitting device 10 is the bottom emission type light emitting device, the material of the first cathode 1061 or the second cathode 1062 may include metal (such as MgAg or Ag), and the material of the anodes (such as the first anode 1041 or the second anode 1042) may include transparent conductive material, but it is not limited thereto. For example, the light emitting device 10 is the top emission type light emitting device, the material of the cathodes (such as the first cathode 1061 and the second cathode 1062) may include transparent conductive material, and the anodes (such as the first anode 1041 or the second anode 1042) may include metal, but it is not limited thereto.

In some embodiments (FIG. 1), the active matrix layer AM may include a plurality of transistors Tr. The light emitting units (e.g. the first light emitting unit LU1 or the second light emitting unit LU2) may respectively include at least one transistor Tr, but it is not limited thereto. The transistor Tr may include an active layer 1080, a gate electrode 1082, a source electrode 1084, and a drain electrode 1086. The anodes 104 may be electrically connected to the drain electrode 1086 of the corresponding transistor Tr through a via respectively, but it is not limited thereto. The active matrix layer AM may include signal lines (scan lines, data lines, reset lines, and/or defense lines, but it is not limited thereto), insulating layers, or other components. In some embodiments, the light emitting device 10 may be an active-matrix light emitting device or a passive-matrix light emitting device, but it is not limited thereto. In some embodiments, the light emitting units may be controlled by external transistors or circuits, but it is not limited thereto.

In some embodiments (FIG. 1), the light emitting device 10 may include a capping layer CP, the capping layer may be disposed on the PDL 102 and/or the composite layers. The capping layer CP may include a single layer or multi-layers. In some embodiments, the capping layer CP may include at least one inorganic layer and/or at least one organic layer. For example (FIG. 1), the capping layer CP may be an inorganic-organic-inorganic (IOI) stacking layers, and the capping layer CP may include an insulating layer 1100, an insulating layer 1102, and an insulating layer 1104. The materials of the insulating layer 1100 and the insulating layer 1104 may include inorganic insulating materials, and the material of the insulating layer 1102 may include organic insulating materials, but it is not limited thereto.

In some embodiments, a light emitted by the organic light emitting layer OEL of the first light emitting unit LU1 and a light emitted by the quantum dot light emitting layer QEL of the second light emitting unit LU2 may have different colors or wavelengths.

The technical features in different embodiments described in this disclosure can be replaced, recombined, or mixed. For making it easier to compare the difference between these embodiments, the following description will detail the dissimilarities among different embodiments and the identical features will not be redundantly described.

Referring to FIG. 2, it is a schematic diagram illustrating a cross-sectional view of a composite layer of a light emitting device according to a second embodiment. FIG. 2 shows a cross-sectional structure of the first composite layer CL1 of the first light emitting unit LU1 in FIG. 1 as an example. Different from the first embodiment, the organic light emitting layer OEL of the first composite layer CL1 of the first light emitting unit LU1 shown in FIG. 2 may be a single layer, but it is not limited thereto. The first composite layer CL1 may include at least one electron injection layer EIL, at least one electron transporting layer ETL, at least one hole injection layer HIL, and at least one hole transporting layer HTL, but it is not limited thereto. For example, the first anode 1041, the hole injection layer HIL, the hole transporting layer HTL, the organic light emitting layer OEL, the electron transporting layer ETL, the electron injection layer EIL, the first cathode 1061 may be disposed on the substrate 100 in sequence, and the first anode 1041 may be disposed between the substrate 100 and the hole injection layer HIL, but it is not limited thereto. In some embodiments, the first anode 1041, the first cathode 1061, or other layers of the first composite layer CL1 (or second composite layer CL2) disposed between the first anode 1041 (or the second anode 1042) and the first cathode 1061 (or the second cathode 1062) may have non-flat top surface and/or non-flat bottom surface, the non-flat top surface and/or the non-flat bottom surface may increase an area of contact surface between two adjacent layers, or the light emitting efficiency of the first light emitting unit LU1 may be increased. The non-flat surface may be a surface having roughness.

In some embodiments, a thickness of the organic light emitting layer OEL may be different from a thickness of the quantum dot light emitting layer QEL. In some embodiments, a ratio of the thickness of the organic light emitting layer OEL to the thickness of the quantum dot light emitting layer QEL may be greater than or equal to 0.1 and less than 1 (0.1≤ratio<1), but it is not limited thereto. In some embodiments, a ratio of the thickness of the quantum dot light emitting layer QEL to the thickness of the organic light emitting layer OEL may be greater than or equal to 0.1 and less than 1 (0.1≤ratio<1), but it is not limited thereto. In some embodiments, the thicknesses of the light emitting layers of different light emitting units may be adjusted according to the materials of the light emitting layers.

The above-mentioned thickness of the composite layer (such as the first composite layer CL1) may be a maximum thickness between the anode (such as the first anode 1041) and the cathode (such as the first cathode 1061) in the normal direction V, but it is not limited thereto. For example, the above-mentioned thickness of the composite layer (such as the first composite layer CL1) may be measured from a top surface of the anode (such as the first anode 1041) to a bottom surface of the cathode (such as the first cathode 1061) in the normal direction V. The above-mentioned thicknesses of the organic light emitting layer OEL and/or the thickness of the quantum dot light emitting layer QEL may be maximum thicknesses of the organic light emitting layer OEL and/or the quantum dot light emitting layer QEL in the normal direction V, but it is not limited thereto. The above-mentioned thicknesses of the composite layers, the thickness of the organic light emitting layer OEL and/or the thickness of the quantum dot light emitting layer QEL may be measured by a scanning electron microscope (SEM) or a high resolution transmission electron microscope (HR-TEM), but it is not limited thereto.

Referring to FIG. 3, it is a schematic diagram illustrating a cross-sectional view of a composite layer of a light emitting device according to a third embodiment. Third embodiment is different from the first embodiment, the organic light emitting layer OEL of the first composite layer CL1 may include two sub-layers (such as a first sub-layer SEL11 and a second sub-layer SEL12). In detail, the first anode 1041, the hole injection layer HIL, the hole transporting layer1 HTL1, the hole transporting layer1 HTL2, the first sub-layer SEL11, the electron transporting layer ETL1, the charge generation layer CGL, the hole transporting layers HTL3, the second sub-layer SEL12, the electron transporting layer ETL2, the electron injection layer EIL, and the first cathode 1061 may be disposed on the substrate 100 in sequence, and the first anode 1041 may disposed between the substrate 100 and the hole injection layer HIL, but it is not limited thereto. The structure described above may be applied to the composite layers in other light emitting units (such as the second light emitting unit LU2). The thicknesses of the first sub-layer SEL11 and the second sub-layer SEL12 may be the same or different, but it is not limited thereto. In some embodiments, the number of the hole transporting layer, the number of the hole injection layer, the number of the electron transporting layer, the number of the electron injection layer EIL, the number of the electron transporting layer, and/or the number of the organic light emitting layer may be adjusted according to different demands. In some embodiments, the number of the hole transporting layer may be different from the number of the electron transporting layer. In some embodiments, the number of the hole injection layer may be different from the number of the electron injection layer.

Figure 4:
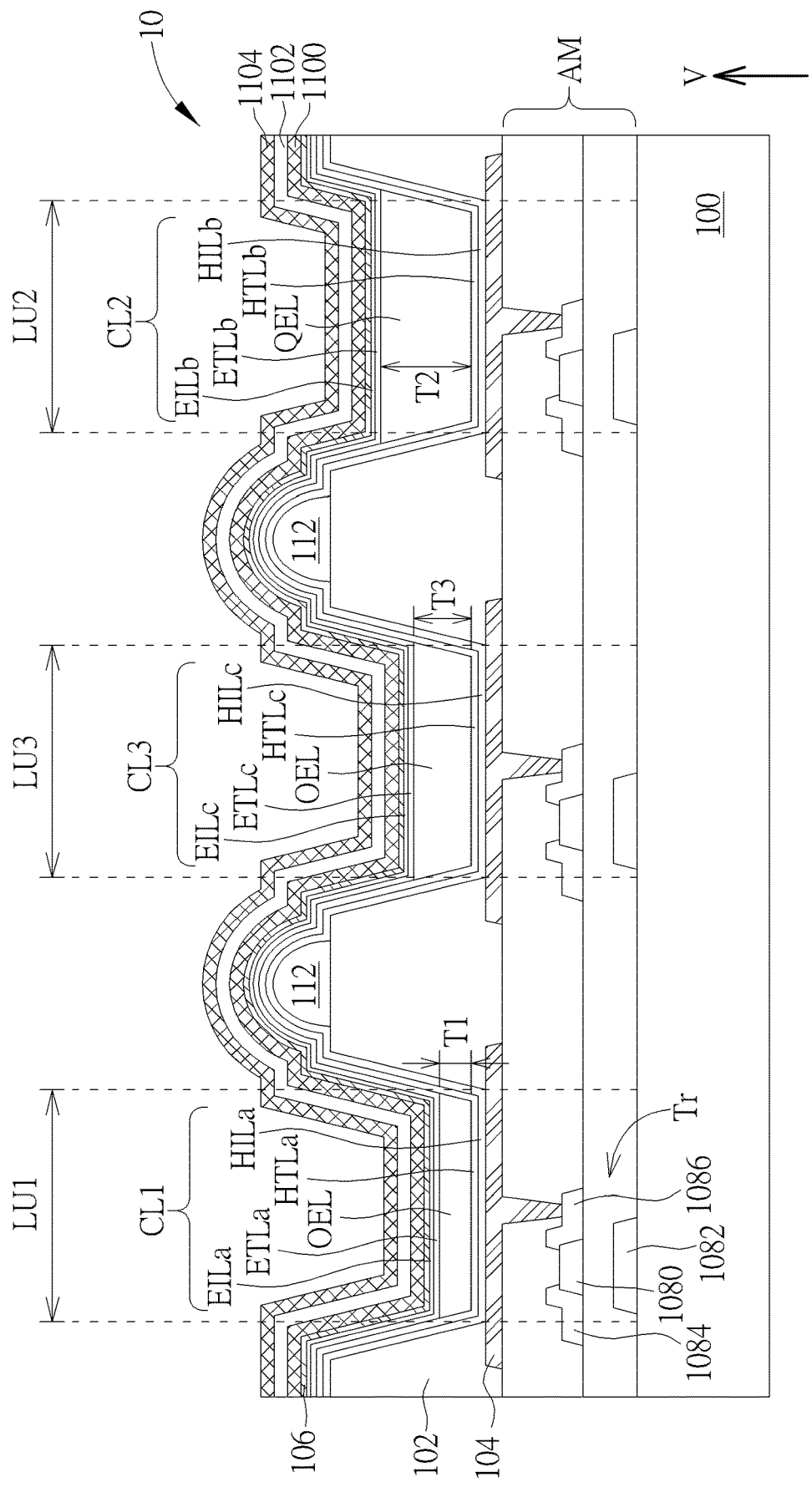
FIG. 4 is a schematic diagram illustrating a cross-sectional view of a light emitting device according to a fourth embodiment.

Referring to FIG. 4, it is a schematic diagram illustrating a cross-sectional view of a light emitting device according to a fourth embodiment. The light emitting device 10 further includes a third light emitting unit LU3, the light emitting unit LU3 may be disposed between the first light emitting unit LU1 and the second light emitting unit LU2 or disposed adjacent to the first light emitting unit LU1 and/or the second light emitting unit LU2, and the third light emitting unit LU3 may include a third composite layer CL3. The structures of the third composite layer CL3 may be the same as or different from the first composite layer CL1 and/or the second composite layer CL2, and the structures of the first composite layer CL1 may be similar to the structure in the second embodiment (or the first embodiment). In some embodiments, the third composite layer CL3 may include organic light emitting layers OEL or quantum dot light emitting layers QEL, but it is not limited thereto. In some embodiments, the thickness of the first composite layer CL1 (and/or the second composite layer CL2) and the thickness of the third composite layer CL3 may be the same or different. In some embodiments (FIG. 4), the thickness T2 of the second composite layer CL2 may be greater than a thickness T3 of the third composite layer CL3, and the thickness T3 of the third composite layer CL3 may be greater than the thickness T1 of first composite layer CL1, but it is not limited thereto. In some embodiments (FIG. 4), the first composite layer CL1 may emit a light with red wavelength, the third composite layer CL3 may emit a light with green wavelength, and the second composite layer CL2 may emit a light with blue wavelength, but it is not limited thereto.

As shown in FIG. 4, the first composite layer CL1 may include a first electron injection layer EILa and a first electron transporting layer ETLa disposed on one side of the organic light emitting layer OEL, the second composite layer CL2 may include a second electron injection layer EILb and a second electron transporting layer ETLb disposed on one side of the quantum dot light emitting layer QEL, and the third composite layer CL3 may include a third electron injection layer EILc and a third electron transporting layer ETLc disposed on one side of the organic light emitting layer OEL. The first electron injection layer EILa, the second electron injection layer EILb, and the third electron injection layer EILc may be connected with each other, or the first electron injection layer EILa, the second electron injection layer EILb, and the third electron injection layer EILc may be disposed by the same process. The first electron transporting layer ETLa, the second electron transporting layer ETLb, and the third electron transporting layer ETLc may be connected with each other, or the first electron transporting layer ETLa, the second electron transporting layer ETLb, and the third electron transporting layer ETLc may be disposed by the same process. In some embodiments (FIG. 4), the electron injection layers (and/or the electron transporting layers) may be disposed corresponding to multiple light emitting units, or the electron injection layers (and/or the electron transporting layers) are continuous, but it is not limited thereto.

In some embodiments (FIG. 4), the first composite layer CL1 may include a first hole injection layer HILa and a first hole transporting layer HTLa disposed on another side of the organic light emitting layer OEL, the second composite layer CL2 may include a second hole injection layer HILb and a second hole transporting layer HTLb disposed on another side of the quantum dot light emitting layer QEL, and the third composite layer CL3 may include a third hole injection layer HILc and a third hole transporting layer HTLc disposed on another side of the organic light emitting layer OEL. The first hole injection layer HILa, the second hole injection layer HILb, and the third hole injection layer HILc may be connected with each other, and the first hole transporting layer HTLa, the second hole transporting layer HTLb, and the third hole transporting layer HTLc may be connected with each other. For example, the first hole injection layer HILa, the second hole injection layer HILb, and the third hole injection layer HILc may be disposed by the same process, and the first hole transporting layer HTLa, the second hole transporting layer HTLb, and the third hole transporting layer HTLc may be disposed by the same process. In another aspect, the hole injection layers (and/or an hole transporting layers) may be disposed corresponding to multiple light emitting units, or the hole injection layers (and/or an hole transporting layers) may be continuous, but it is not limited thereto.

In some embodiments, the electron injection layers, the electron transporting layers, the hole injection layers, and/or the hole transporting layers of different light emitting units may be connected with each other or separated. In some embodiments, the electron injection layers, the electron transporting layers of different light emitting units may be connected with each other, but the hole injection layers and/or the hole transporting layers in different light emitting units may be separated. In some embodiments, the electron injection layers and/or the electron transporting layers of different light emitting units may be separated, but the hole injection layers and/or the hole transporting layers in different light emitting units may be connected with each other.

As shown in FIG. 4, the anodes 104 may be disposed (or formed) before disposing (or forming) the PDL 102, and the PDL 102 may partially cover (or overlap with) the anodes 104 in the normal direction V. In addition, the light emitting device 10 may include a plurality of spacers 112 disposed on the PDL 102, the spacers 112 may not be overlapped with the aperture of the PDL in the normal direction V. The material of the spacers 112 may be different from the material of the PDL 102, or the spacers 112 and the PDL 102 may be formed in different process, but it is not limited thereto. In some embodiments, the material of the spacers 112 and the material of the PDL 102 may be the same, or the spacers 112 and the PDL 102 may be formed in the same process, but it is not limited thereto.

In some embodiments, the layers of the first composite layer CL1 and/or the layers of the second composite layer CL2 may be manufactured in the same or different processes (such as the inkjet process or the evaporation process), but it is not limited thereto.

Figure 5:
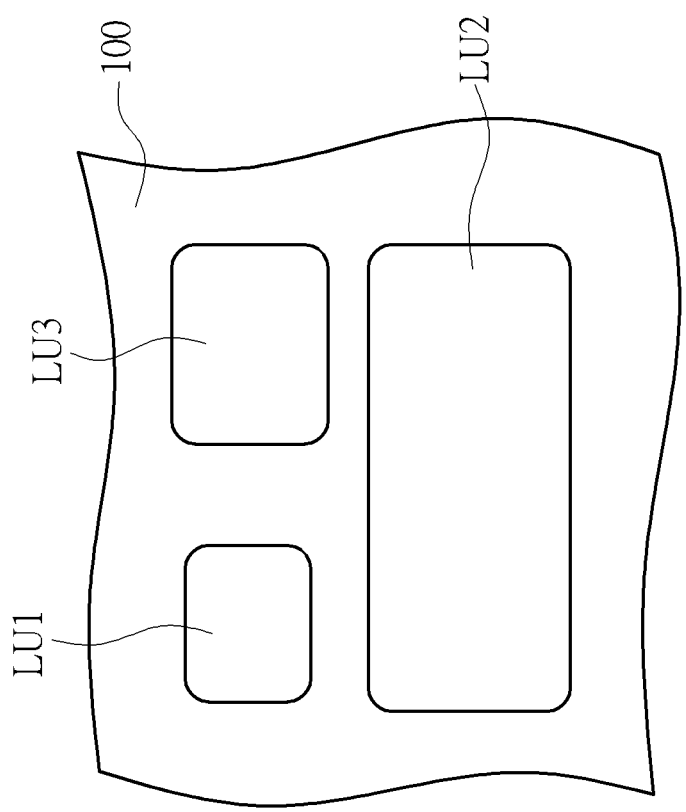
FIG. 5 is a schematic diagram illustrating areas of a first light emitting unit, a second light emitting unit, and a third light emitting unit according to a variant embodiment of the fourth embodiment.

Referring to FIG. 5, it is a schematic diagram illustrating the areas of a first light emitting unit, a second light emitting unit, and a third light emitting unit according to a variant embodiment of the fourth embodiment. For example, FIG. 5 illustrates the areas of the first light emitting unit LU1, the second light emitting unit LU2, and the third light emitting unit LU3 in one of the pixels, and the first light emitting unit LU1, the second light emitting unit LU2, and the third light emitting unit LU3 may be sub-pixels with different colors (or wavelengths), but it is not limited thereto. The materials used for emitting lights with different colors (or wavelengths) may have different emitting efficiencies, and the intensities of lights with different colors (or wavelengths) may be different. In some embodiments, when the intensities of lights emitted by different light emitting units are different, the areas of different light emitting units may be different. For example (FIG. 5), the areas of the first light emitting unit LU1, the second light emitting unit LU2, and/or the third light emitting unit LU3 may be different in order to increase the uniformity of light intensity. For example, the blue light emitted by the light emitting unit (such as the second light emitting unit LU2) has the weakest intensity and the red light emitted by the light emitting unit (such as the first light emitting unit LU1) has the strongest intensity, the area of the light emitting unit emitting the blue light may be greater than and the area of the light emitting unit emitting the red light, but it is not limited thereto. As shown in FIG. 5, the area of the second light emitting unit LU2 may be greater than the area of the third light emitting unit LU3, and the area of the third light emitting unit LU3 may be greater than the area of the first light emitting unit LU1, but it is not limited thereto. In some embodiments, the areas of the first light emitting unit LU1, the second light emitting unit LU2, and the third light emitting unit LU3 may be adjusted according to the materials of light emitting layers. In some embodiments, the area of the first light emitting unit LU1 may be different from or the same as the area of the second light emitting unit LU2 (and/or the third light emitting unit LU3).

In some embodiments, the shape of the light emitting units may include rectangle with rounded corners, hexagon, rhombus, circle, but it is not limited thereto. In some embodiments, the light emitting units may include round, polygonal, triangular or arc-shaped or other irregular shape, but it is not limited thereto. In some embodiments, the area of the light emitting unit may be defined by the corresponding aperture of the PDL 102 by a microscope, but it is not limited thereto. For example, the area of the light emitting unit may be defined by a bottom surface of the aperture of the PDL 102

In some embodiments, the first light emitting unit LU1, the second light emitting unit LU2, and the third light emitting unit LU3 may include the organic light emitting layer or the quantum dot light emitting layer. However, in the hybrid light emitting device, at least one of the first light emitting unit LU1, the second light emitting unit LU2, and the third light emitting unit LU3 includes the organic light emitting layer, and at least another one of the first light emitting unit LU1, the second light emitting unit LU2, and the third light emitting unit LU3 includes the quantum dot light emitting layer. The type of material of the light emitting layer of the first light emitting unit LU1 may be different from the type of material of the light emitting layer of the second light emitting unit LU2, and the type of the material of the light emitting layer of the first light emitting unit LU1 may be different from or the same as the type of material of the light emitting layer of the third light emitting unit LU3.

Figure 6:
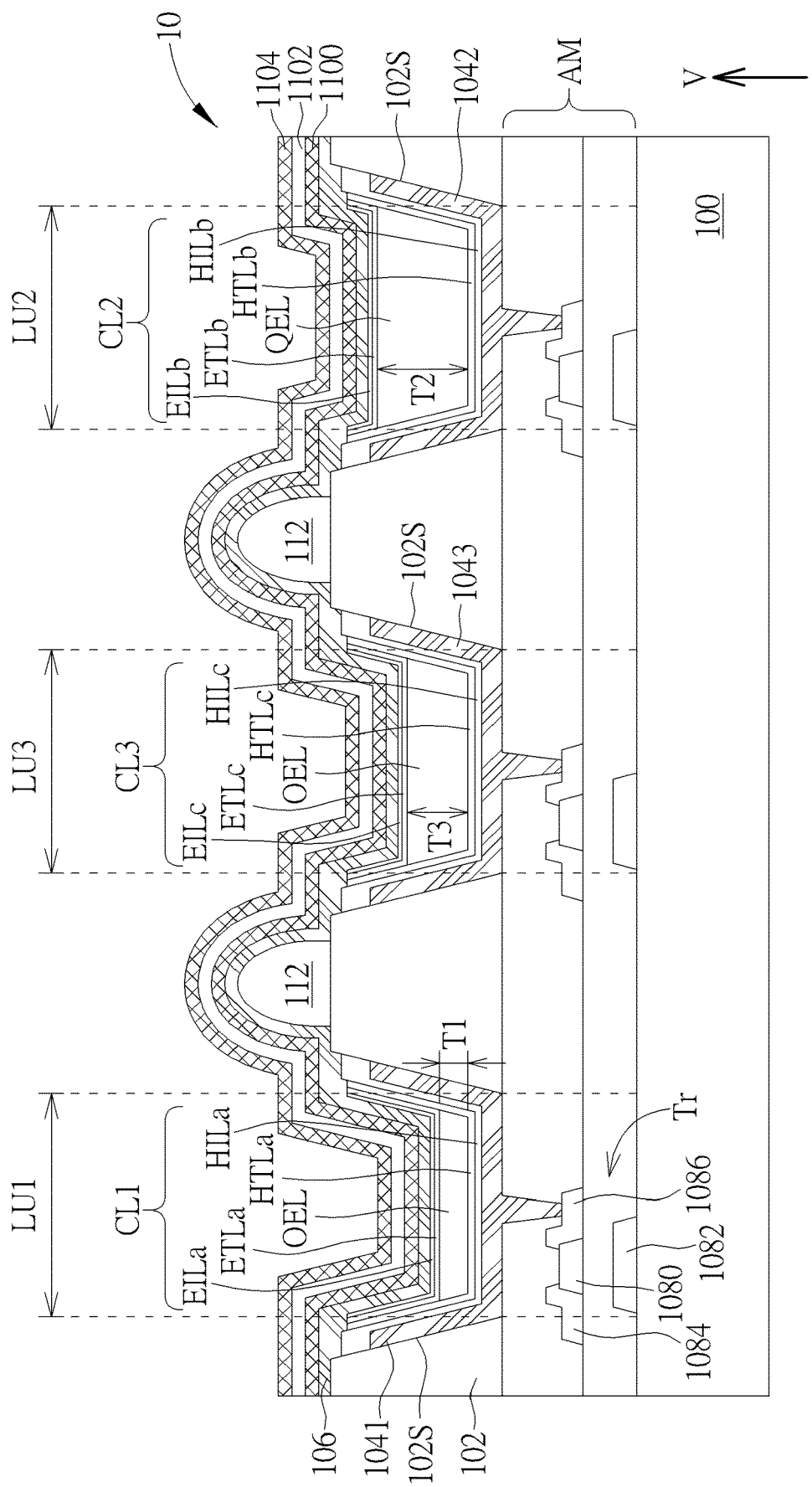
FIG. 6 is a schematic diagram illustrating a cross-sectional view of a light emitting device according to a fifth embodiment.

Referring to FIG. 6, it is a schematic diagram illustrating a cross-sectional view of a light emitting device according to a fifth embodiment. Different from the fourth embodiment, the electron injection layers (e.g. EILa, EILb, and EILc), the electron transporting layers (e.g. ETLa, ETLb, and ETLc), the hole injection layers (e.g. HILa, HILb, and HILc), and the hole transporting layers (e.g. HTLa, HTLb, and HTLc) of the first composite layer CL1, the second composite layer CL2, and the third composite layer CL3 may be separated by the PDL 102, or the electron injection layers, the electron transporting layers, the hole injection layers, and the hole transporting layers of the first composite layer CL1, the second composite layer CL2, and the third composite layer CL3 may be discontinuous. The separated electron injection layers, the separated electron transporting layers, the separated hole injection layers, or the separated hole transporting layers may be formed by the same or different patterning process, but it is not limited thereto. In addition, the PDL 102 may include a plurality of side surfaces 102s, the first anode 1041 of the first light emitting unit LU1, the second anode 1042 of the second light emitting unit LU2 and/or a third anode 1043 of the third light emitting unit LU3 may contact with at least a part of the side surface 102s of the PDL 102, and these anodes may be formed by the same or different patterning process, but it is not limited thereto. In some embodiments, parts of the layers (such as the electron injection layers, the electron transporting layers, the hole injection layers, or the hole transporting layers) of the first composite layer CL1, the second composite layer CL2, and/or the third composite layer CL3 may be separated by the PDL 102, but other parts of the layers of the first composite layer CL1, the second composite layer CL2, and/or the third composite layer CL3 may be continuous.

Figure 7:
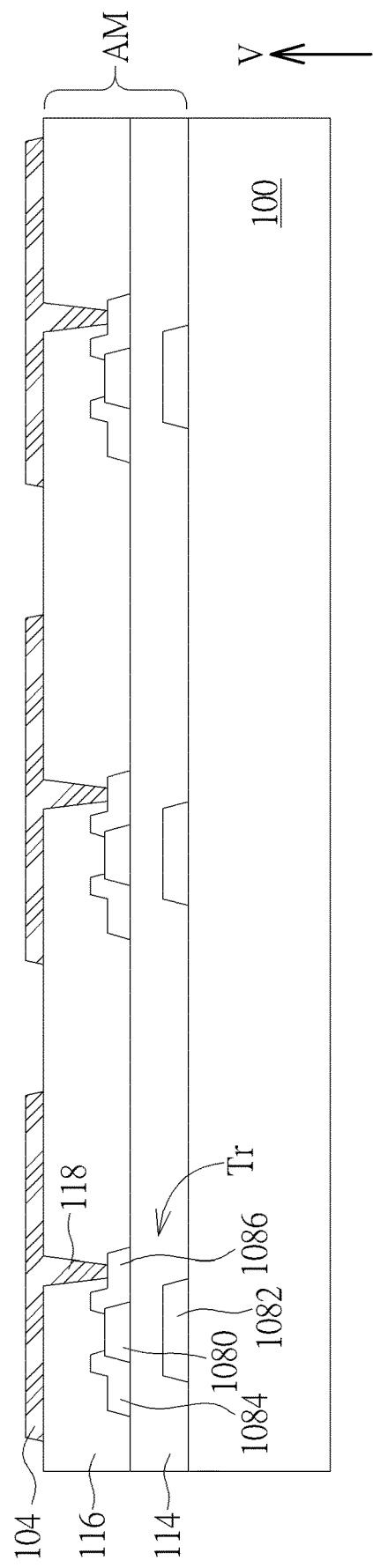
FIG. 7 is a schematic diagram illustrating a step of providing a substrate, an active matrix layer, and anodes in a manufacturing method of a light emitting device according to a sixth embodiment.
Figure 8:
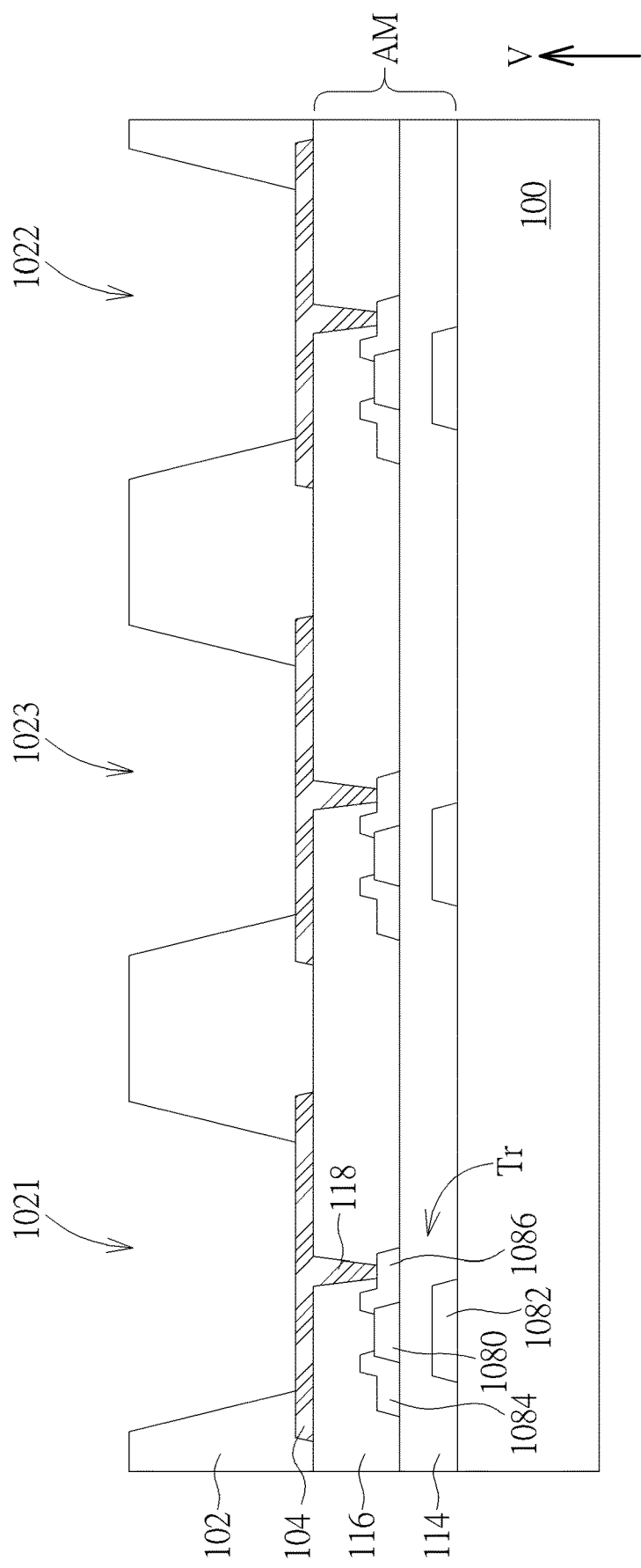
FIG. 8 is a schematic diagram illustrating a step of forming a pixel defining layer in the manufacturing method of the light emitting device according to the sixth embodiment.
Figure 11:
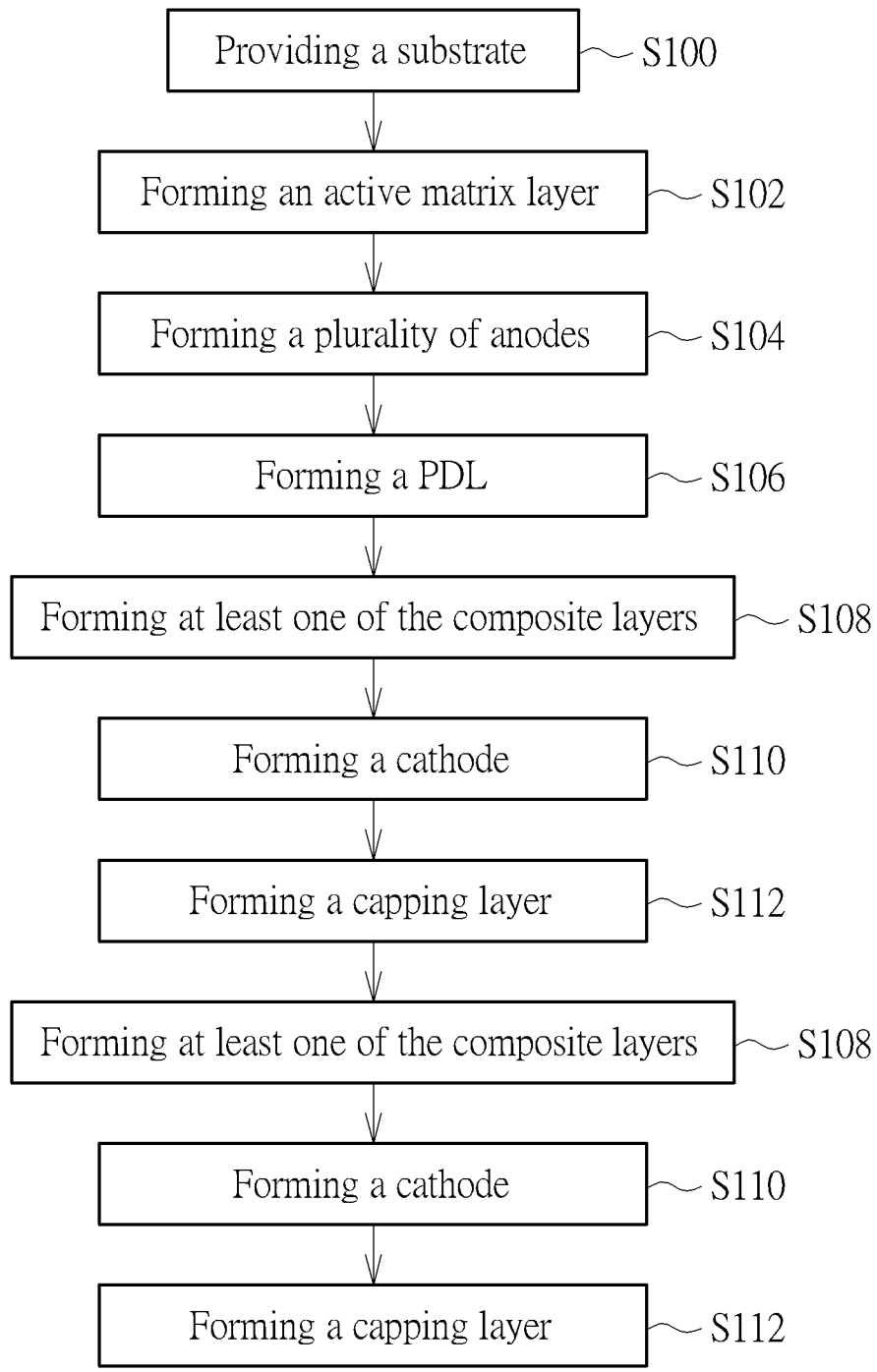
FIG. 11 is a schematic diagram illustrating a process flow of the manufacturing method of the light emitting device of the present disclosure.

Referring to FIG. 7, FIG. 8, FIGS. 9A-9D, and FIG. 11, FIG. 7 is a schematic diagram illustrating some step in a manufacturing method of a light emitting device according to a sixth embodiment, FIG. 8 is a schematic diagram illustrating a step of forming a pixel defining layer, FIGS. 9A-9D are schematic diagrams illustrating steps of forming composite layers, a cathode, and capping layers, and FIG. 11 is a schematic diagram illustrating a process flow of the manufacturing method of the light emitting device of the present disclosure. The formation of components in the light emitting device may include deposition processes or patterning processes (e.g. lithography and etching processes) usually used in the semiconductor fabrication or other process, which will not be redundantly mentioned in the following description.

Referring to FIG. 7 and FIG. 11, a step S100 may be providing a substrate 100. Next, a step S102 may be forming an active matrix layer AM. For example, the active matrix layer AM may be formed on the substrate 100, and the step of forming the active matrix layer AM may include forming a plurality of transistors Tr and a plurality of insulating layers. For example, a plurality of gate electrodes 1082, a gate insulating layer 114, an active layer 1080, a plurality of drain electrodes 1086 (and a plurality of source electrodes 1084), the insulating layer 116 may be sequentially formed, wherein the plurality of drain electrodes 1086 and the plurality of source electrodes 1084 may be formed by the same process, but it is not limited. The drain electrodes 1086 and the source electrodes 1084 may partially cover (or overlap with) the corresponding active layer 1080 in the normal direction V. The manufacturing method or structure of the transistors Tr is not limited to the description above. Additionally, a plurality of through holes may be formed in the insulating layer 116. Next, a step S104 may be forming a plurality of anodes 104, which may be formed on the insulating layer 116, and the conductive material of the anodes 104 may be disposed in (or filled in) the through holes to form a plurality of vias 118, and the anodes 104 may be electrically connected to the corresponding drain electrode 1086.

Referring to FIG. 8 and FIG. 11, a step S106 may be forming a PDL 102, which may be formed on the anodes 104. The PDL 102 may partially cover (or overlap with) the anodes 104 in the normal direction V, and the PDL 102 includes a plurality of apertures 1021, 1022, and 1023, and each of the apertures may expose a portion of the corresponding anode 104. In some embodiments, the anodes 104 may be formed before forming the PDL 102, or the step S104 may be performed after the step S106, but it is not limited thereto. In some embodiments (FIG. 6), the anodes 104 may be formed after forming the PDL 102.

Figure 9A:
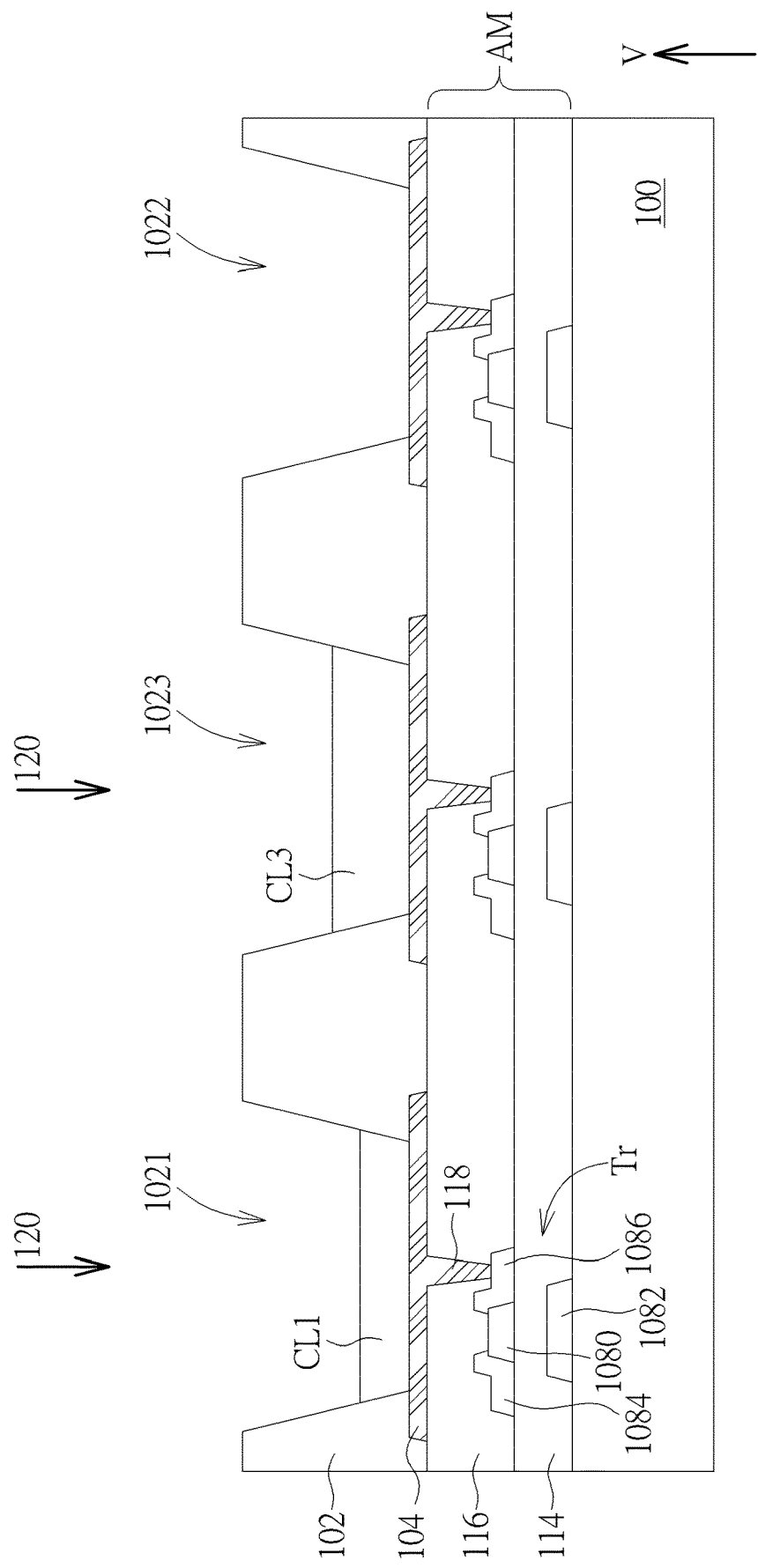
FIGS. 9A-9D are schematic diagrams illustrating steps of forming composite layers, a cathode, and capping layers in the manufacturing method of the light emitting device according to the sixth embodiment.

Referring to FIG. 9A and FIG. 11, a step S108 may be forming at least one of the composite layers. For example, the first composite layer CL1 may be formed in the aperture 1021, and the third composite layer CL3 may be formed in the aperture 1023. The first composite layer CL1 and the third composite layer CL3 may include quantum dot light emitting layers or organic light emitting layers, and the first composite layer CL1 and the third composite layer CL3 may be formed by an inkjet process 120, but it is not limited thereto. The first composite layer CL1 and the third composite layer CL3 may be formed in the same process or different processes.

Figure 9B:
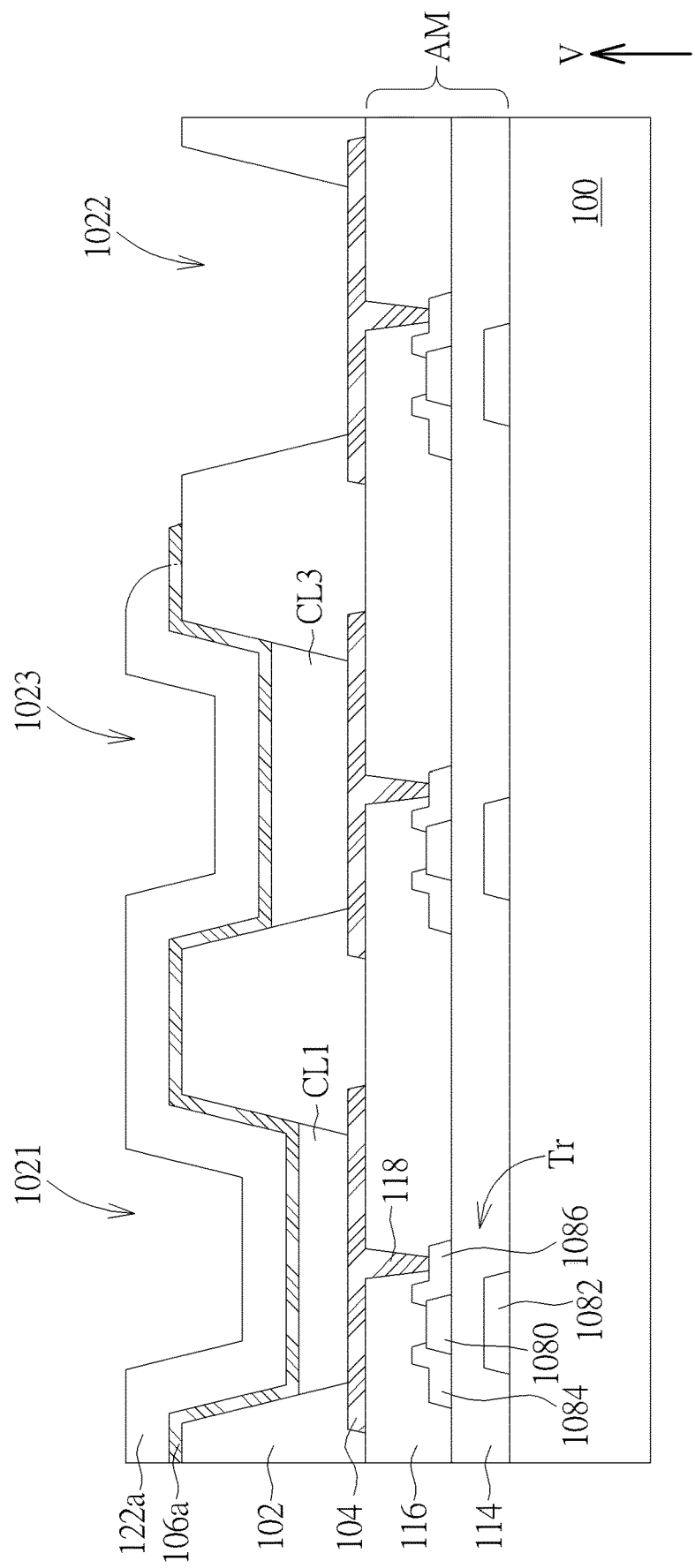

Referring to FIG. 9B and FIG. 11, a step S110 may be forming a cathode. For example, a cathode 106a may be formed on or corresponding to the first composite layer CL1 and the third composite layer CL3, or the cathode 106a may be overlapped with the first composite layer CL1 and the third composite layer CL3 in the normal direction V, and the cathode 106a may not formed on or corresponding to the aperture 1022. Next, a step S112 may be forming a capping layer. For example, a capping layer 122a may be formed on the cathode 106a, the capping layer 122a may formed on the cathode 106a, and the capping layer 122a may cover a portion of the cathode 106a, and another portion of the cathode 106a may be exposed, but it is not limited.

Figure 9C:
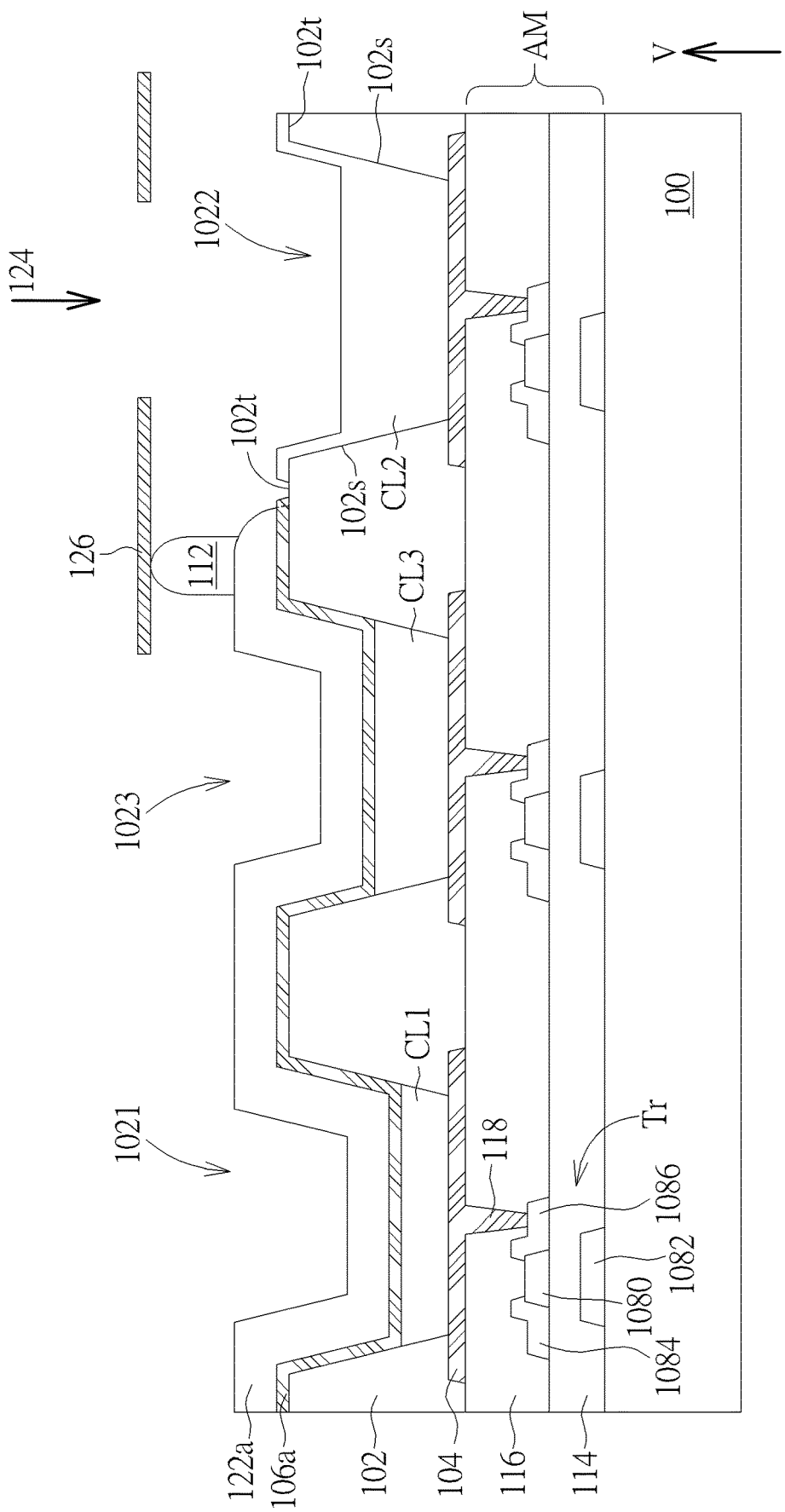

Referring to FIG. 9C and FIG. 11, the step S108 may be performed again, and a second composite layer CL2 may be formed in the aperture 1022, the second composite layer CL2 may include the organic light emitting layer or quantum dot light emitting layers, and the type of material of the light emitting layer of the first composite layer CL1 may be different from the type of the material of the light emitting layer of the second composite layer CL2, and the second composite layer CL2 may be formed by an evaporation process 124, but it is not limited thereto. Additionally, at least one spacer 112 may be formed on a portion of the PDL 102 adjacent to the aperture 1022 before forming the second composite layer CL2. For example, a metal mask 126 (e.g. a fine metal mask) may be used in the evaporation process 124, and the metal mask 126 may be disposed on the spacer 112, but it is not limited thereto. In some embodiments (FIG. 9C), the second composite layer CL2 may cover at least a part of the side surface 102s of the PDL 102 and a portion of a top surface 102t of the PDL 102, but it is not limited thereto. In some embodiments (not shown), the second composite layer CL2 may not cover the top surface 102t of the PDL 102.

Figure 9D:
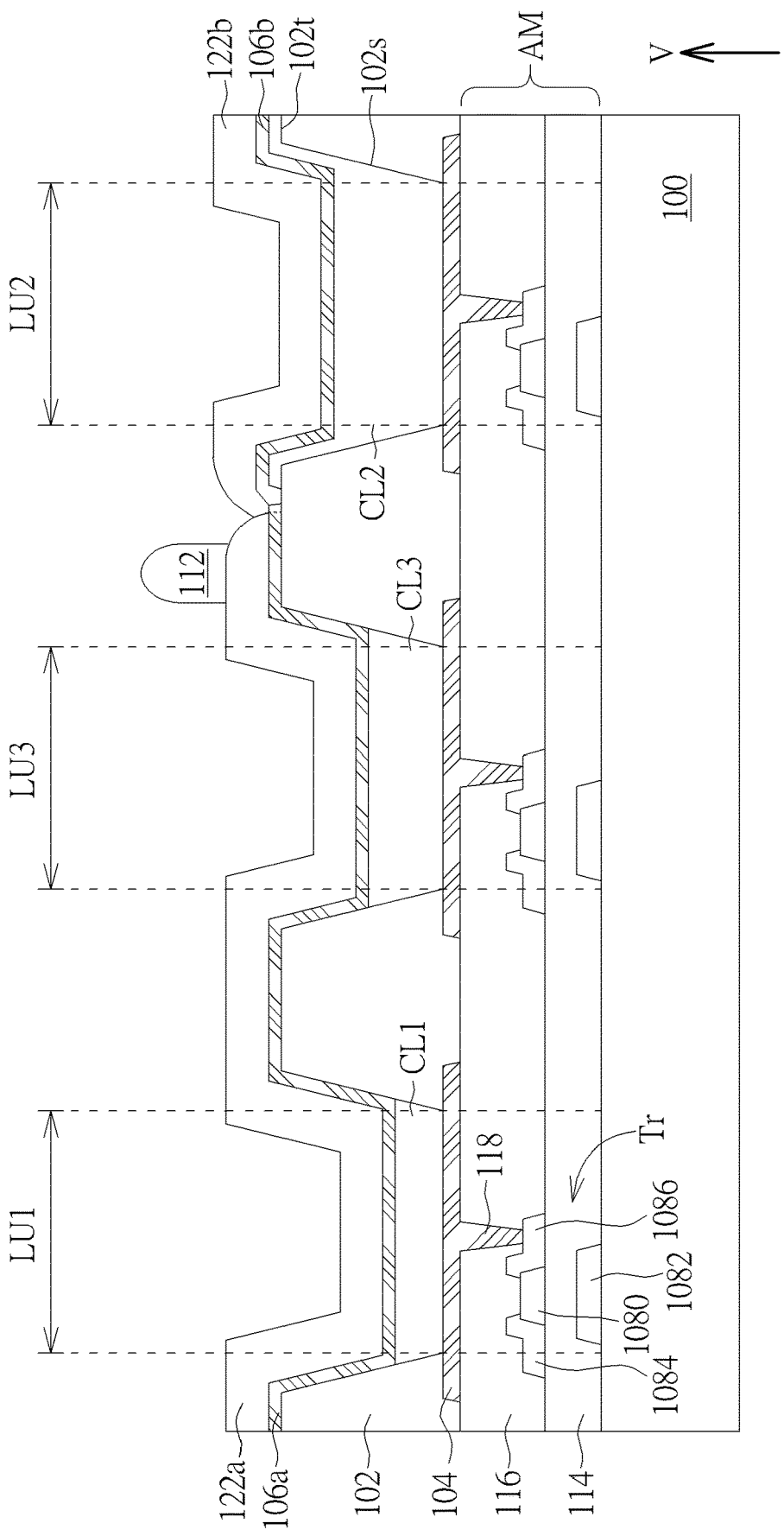

Referring to FIG. 9D and FIG. 11, the step S110 may be performed again, a cathode 106b may be formed on or corresponding to the second composite layer CL2, and the cathode 106b may be connected to (or contact with) the cathode 106a. In some embodiments (not shown), at least a part of the cathode 106b may be formed on the portion of the cathode 106a, but it is not limited thereto. Next, the step S112 may be performed again, and a capping layer 122b may be formed on or corresponding to the cathode 106b. The capping layer 122b may be connected to (or contact with) the capping layer 122a. In some embodiments, a part of the capping layer 122b may be overlapped with a part of the capping layer 122a in the normal direction V.

The capping layers 122a, 122b may include at least one organic insulating layer or at least one inorganic insulating layer. In some embodiments (FIG. 9D), the capping layers 122a, 122b may include IOI layers (inorganic insulating layer-organic insulating layer-inorganic insulating layer), but it is not limited thereto.

In some embodiment (not shown), the second composite layer CL2 and the third composite layer CL3 may formed in the same process. In some embodiment (not shown), the type of material (such as quantum dot light emitting layer or organic light emitting layer) of the light emitting layer of the second composite layer CL2 may be the same as the type of material of the light emitting layer of the third composite layer CL3. In some embodiment, the type of material of the light emitting layer of the first composite layer CL1 may be the same as the type of material of the light emitting layer of the third composite layer CL3. It should be noted that, the type of material of the light emitting layer of the first composite layer CL1 may be different from the type of material of the light emitting layer of the second composite layer CL2.

In some embodiment, the inkjet process 120 may be used for forming some composite layers before performing the evaporation process 124 used for forming the other composite layers. Since the chamber used for performing the inkjet process 120 may have better cleanliness, the other composite layers formed subsequently by evaporation process 124 may reduce an effect by the inkjet process 120. In some embodiment, the first composite layer CL1 and/or the third composite layer CL3 may be covered by the capping layer 122a before performing the evaporation process 124 or other subsequent processes, the capping layer 122a can reduce the chance of the first composite layer CL1 and/or the third composite layer CL3 being affected by the evaporation process 124 or subsequent processes.

The first composite layer CL1, the second composite layer CL2, and the third composite layer CL3 may include the structures of the composite layers described in the above-mentioned embodiments. In some embodiments, the quantum dot light emitting layers may be formed by the inkjet process 120 or the evaporation process 124, and the organic light emitting layers may be formed by the inkjet process 120 or the evaporation process 124. The inkjet process 120 may be performed before performing the evaporation process 124. In other embodiments, the inkjet process 120 may be performed after performing the evaporation process 124. In some embodiments, the layers of one of the composite layers may be formed by the inkjet process 120 or the evaporation process 124, but it is not limited thereto. In some embodiments, part of the layers of one of the composite layers may be formed by the inkjet process 120, and the other part of the layers may be formed by the evaporation process 124. In some embodiments, the first composite layer CL1, the second composite layer CL2, and the third composite layer CL3 may be formed by the same process (such as the inkjet process 120, the evaporation process 124 or other suitable process).

Figure 10A:
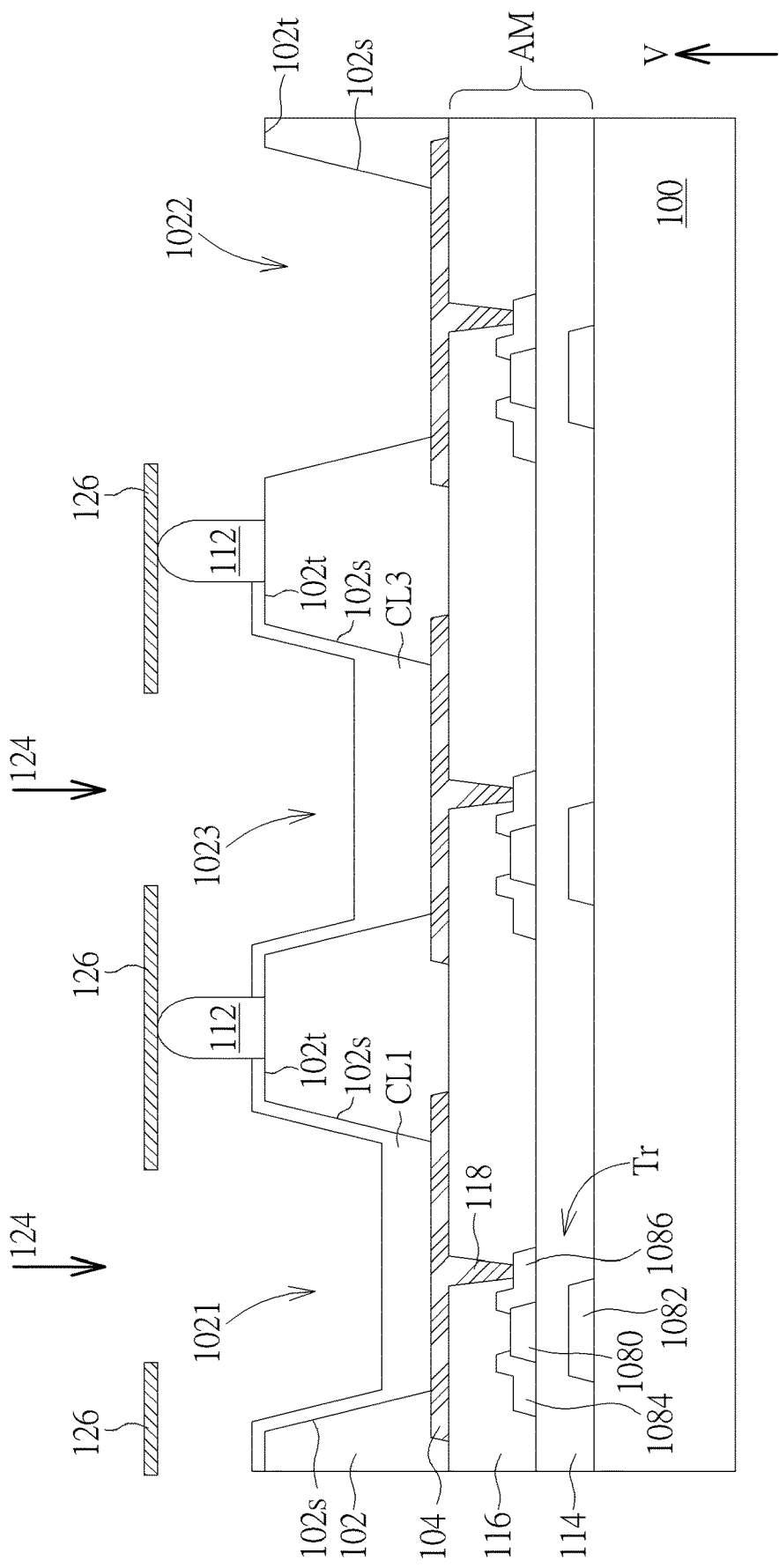
FIGS. 10A-10D are schematic diagrams illustrating steps of forming composite layers, a cathode, and capping layers in the manufacturing method of the light emitting device according to a seventh embodiment.

Referring to FIGS. 10A-10D, which are schematic diagrams illustrating steps of forming composite layers, a cathode, and capping layers in the manufacturing method of the light emitting device according to a seventh embodiment. Different from the sixth embodiment, the evaporation process 124 used for forming the first composite layer CL1 and/or the third composite layer CL3 may be performed before performing the inkjet process 120 used for forming the second composite layer CL2. Referring to FIG. 10A and FIG. 11, a step S108 may be forming at least one composite layer. The step S108 presented in FIG. 10A may be subsequent to the step S106 presented in FIG. 8. For example, the first composite layer CL1 and the third composite layer CL3 may be formed in the same process or different processes in the seventh embodiment. As shown in FIG. 10A, the first composite layer CL1 and the third composite layer CL3 may cover at least a part of the side surface 102s of the PDL 102 and portions of top surfaces 102t of the PDL 102, but it is not limited thereto. In addition, the spacers 112 may be formed on a portion of the PDL 102 before forming the first composite layer CL1 and the third composite layer CL3, at least one of the spacers 112 may be disposed between two adjacent apertures of the PDL 102, and the spacers 112 may not be overlapped with the aperture of the PDL 102 in the normal direction V. In some embodiments, the spacers 112 and the PDL 102 may be formed in the same process, or the spacers 112 and the PDL 102 may include the same material. In some embodiments, the spacers 112 and the PDL 102 may be formed in different processes, and the spacers 112 and the PDL 102 may include different materials. Further, a metal mask 126 may be used in the evaporation process 124, and the metal mask 126 may be disposed on the spacer 112, but it is not limited thereto.

Figure 10B:
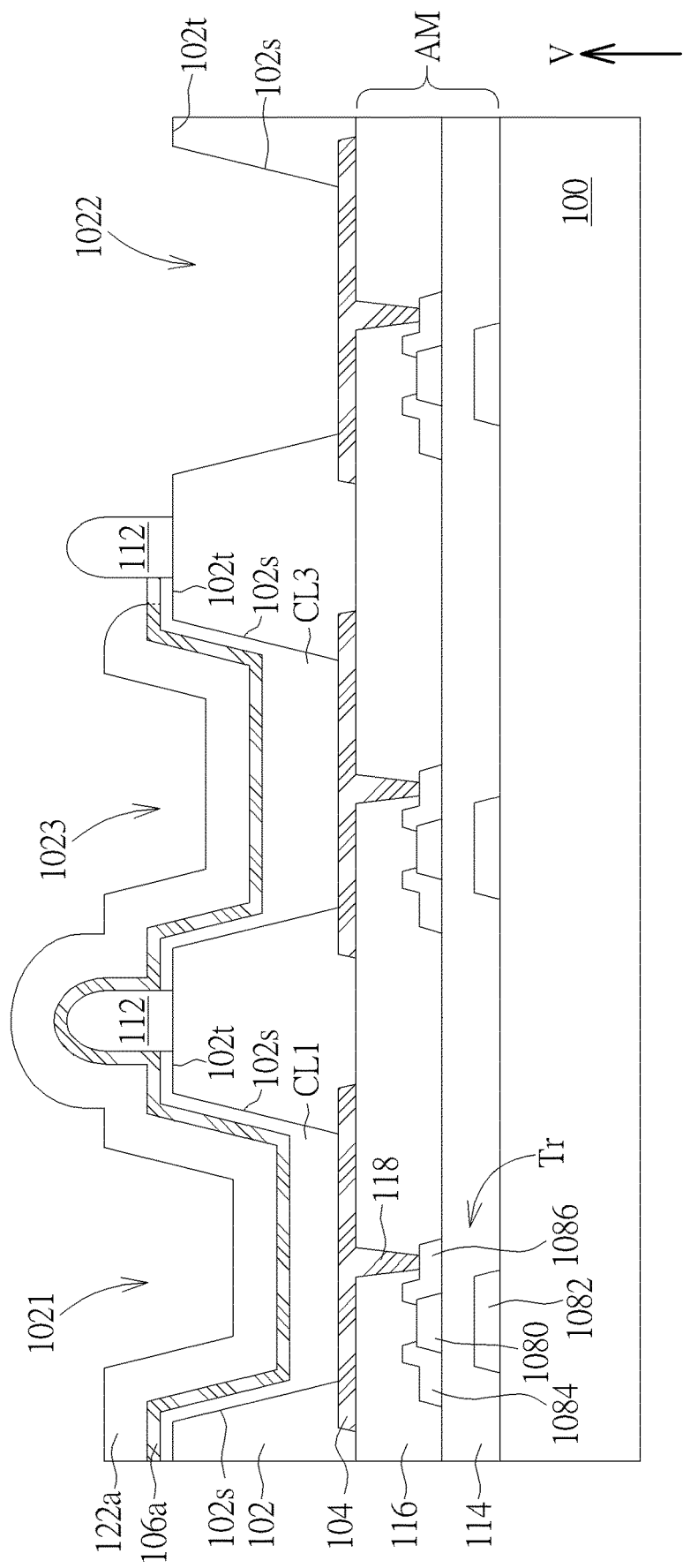

Referring to FIG. 10B and FIG. 11, a step S110 may be forming a cathode. For example, the cathode 106a may be formed on or corresponding to the first composite layer CL1 and/or the third composite layer CL3, or the cathode 106a may be overlapped with the first composite layer CL1 and the third composite layer CL3 in the normal direction V, and the cathode 106a may not be formed on or corresponding to the aperture 1022, one of the spacers 112 disposed between the aperture 1021 and the aperture 1022 may be covered by the cathode 106a, and one of the spacers 112 disposed between the aperture 1022 and the aperture 1023 may not be covered by the cathode 106a, but it is not limited thereto. Next, a step S112 may be forming a capping layer. For example, the capping layer 122a may be formed on the cathode 106a, the capping layer 122a may partially cover the cathode 106a, or another portion of the cathode 106a may be exposed, but it is not limited.

Figure 10C:
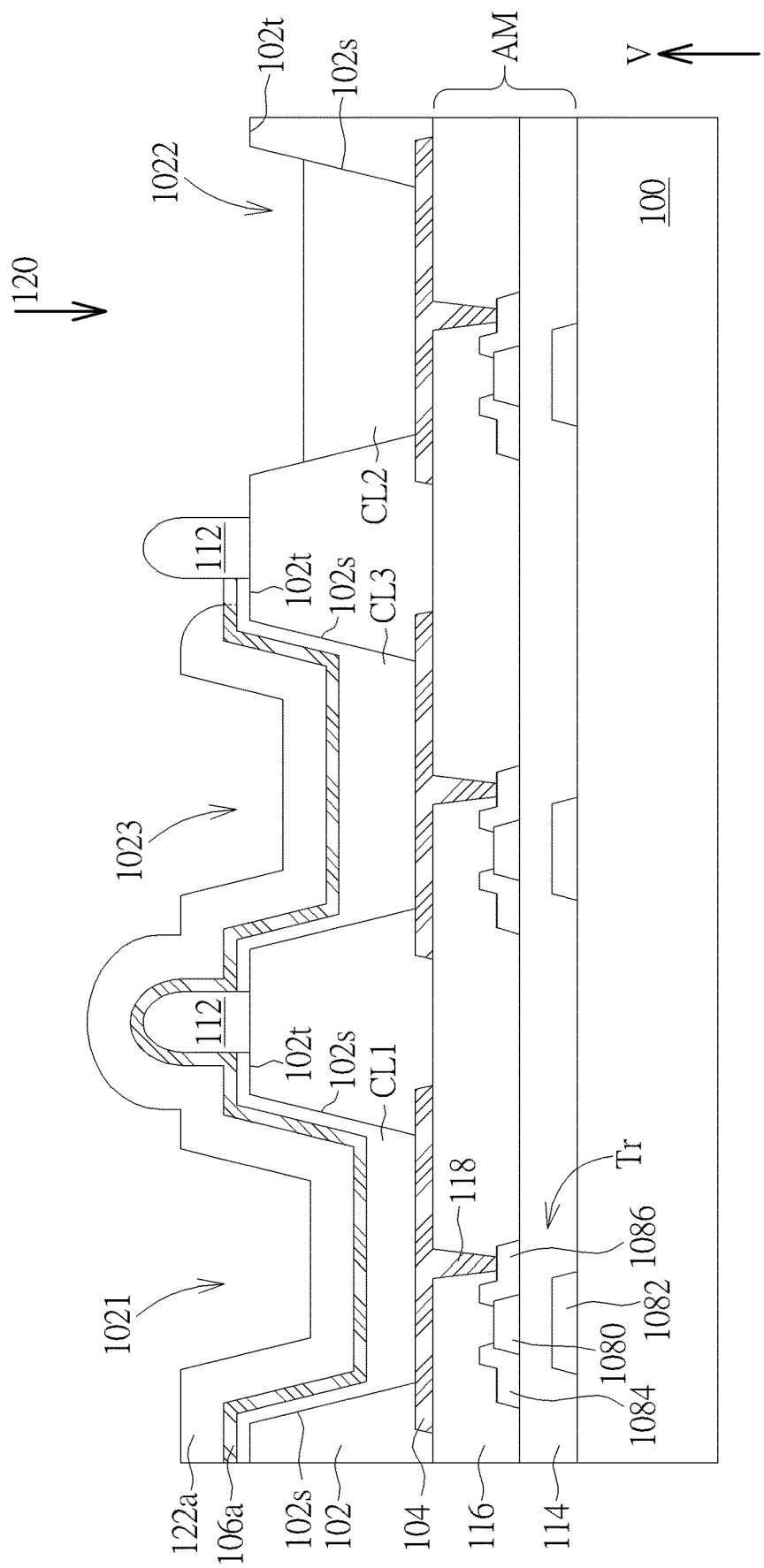

Referring to FIG. 10C and FIG. 11, the step S108 may be performed again, a second composite layer CL2 may be formed in the aperture 1022, and the second composite layer CL2 may be formed by the inkjet process 120. As shown in FIG. 10C, the second composite layer CL2 may partially cover the side surface 102s of the PDL 102, but it is not limited thereto.

Figure 10D:
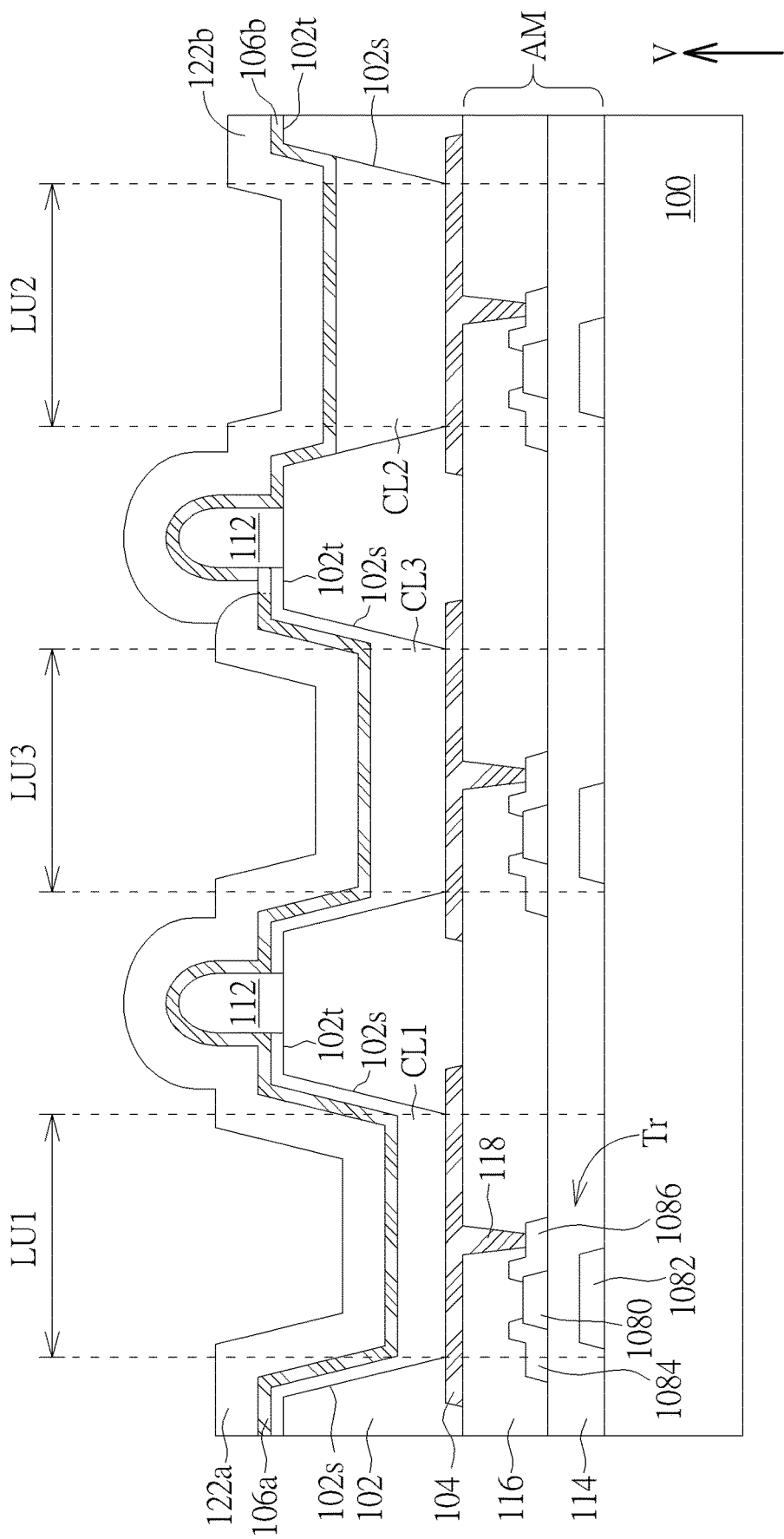

Referring to FIG. 10D and FIG. 11, the step S110 may be performed again, a cathode 106b may be formed on the second composite layer CL2, and the cathode 106b may be connected to the cathode 106a. Next, the step S112 may be performed again, and a capping layer 122b may be formed on the cathode 106b. The capping layer 122b may be connected to (or contact with) the capping layer 122a. In some embodiments, a part of the capping layer 122b may be overlapped with a part of the capping layer 122a in the normal direction V.

Figure 12:
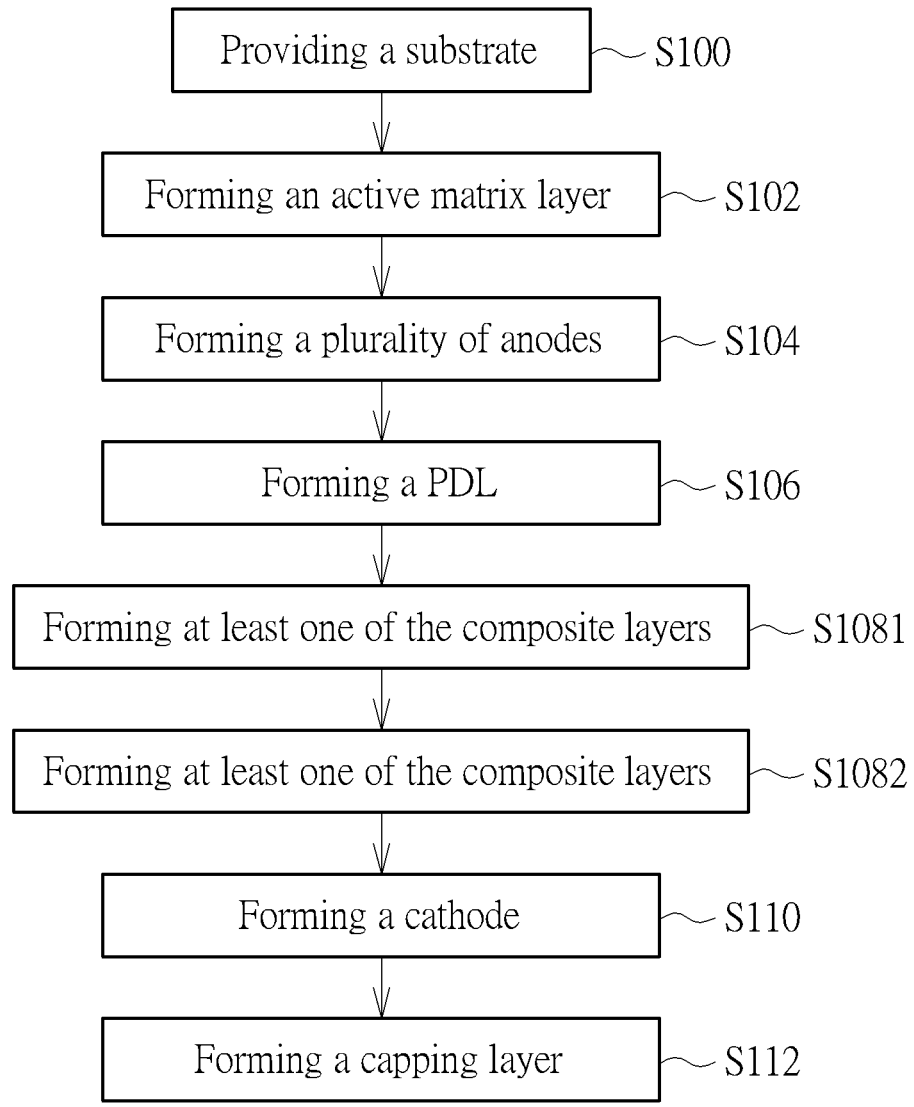
FIG. 12 is a schematic diagram illustrating another process flow of the manufacturing method of the light emitting device of the present disclosure.

Referring to FIG. 12, FIG. 12 is a schematic diagram illustrating another process flow of the manufacturing method of the light emitting device of the present disclosure. Different from the process flow of the manufacturing method shown in FIG. 11, a step S1082 (forming the second composite layer CL2) may be performed after performing a step S1081 (forming the first composite layer CL1 and/or the third composite layer CL3), and the step S110 (forming a cathode) may be performed after performing the step S1082 (forming the second composite layer CL2), and the step S112 (forming a capping layer) may be performed after performing the step S110 (forming a cathode), the cathode and/or the capping layer formed on different composite layers (such as the first composite layer CL1, the second composite layer CL2, and the third composite layer CL3) may be in the same process, or the cathode and/or the capping layer formed on different composite layers (such as the first composite layer CL1, the second composite layer CL2, and the third composite layer CL3) may be continuous.

In summary, the hybrid light emitting device can include at least one light emitting unit with the organic light emitting layer and at least one light emitting unit with the quantum dot light emitting layer. The organic light emitting layer or the quantum dot light emitting layer may be disposed in the composite layer of the light emitting unit, the composite layer in the light emitting units may include at least one sub-layer (light emitting layer), and the thickness of the composite layer or the thickness of the light emitting layer can be adjusted. Therefore, the thicknesses of the composite layers or the thickness of the light emitting layers of different light emitting units may be different. In addition, the brightness or lifetime of the light emitting units can be adjusted by adjusting the thickness of the composite layer or the thickness of the light emitting layer in the light emitting unit. Therefore, the light emitting device can increase uniform brightness or the lifetime according to the present disclosure.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A light emitting device, comprising:
a first light emitting unit comprising a first composite layer, and the first composite layer comprising an organic light emitting layer; and
a second light emitting unit adjacent to the first light emitting unit, comprising a second composite layer, and the second composite layer comprising a quantum dot light emitting layer;
wherein a thickness of the first composite layer is less than a thickness of the second composite layer.

2. The light emitting device of claim 1, wherein a ratio of the thickness of the first composite layer to the thickness of the second composite layer is greater than or equal to 0.1 and less than 1.

3. The light emitting device of claim 1, wherein the organic light emitting layer and the quantum dot light emitting layer are manufactured in different processes.

4. The light emitting device of claim 1, wherein the first light emitting unit further comprises a first anode and a first cathode respectively electrically connected to the first composite layer, and the second light emitting unit further comprises a second anode and a second cathode respectively electrically connected to the second composite layer.

5. The light emitting device of claim 4, wherein the first anode and the second anode are manufactured in a same process.

6. The light emitting device of claim 4, wherein the first cathode and the second cathode are manufactured in a same process.

7. The light emitting device of claim 4, further comprising a pixel defining layer, wherein the first anode or the second anode contacts with at least a part of a side surface of the pixel defining layer.

8. The light emitting device of claim 1, wherein the organic light emitting layer comprises a plurality of sub-layers having different thicknesses.

9. The light emitting device of claim 1, wherein the quantum dot light emitting layer comprises a plurality of sub-layers having different thicknesses.

10. The light emitting device of claim 1, wherein the organic light emitting layer or the quantum dot light emitting layer comprises a first sub-layer, a second sub-layer, and a third sub-layer, the second sub-layer is disposed between the first sub-layer and the third sub-layer, and a thickness of the second sub-layer is less than a thickness of the first sub-layer or a thickness of the third sub-layer.

11. The light emitting device of claim 1, wherein a light emitted by the organic light emitting layer and a light emitted by the quantum dot light emitting layer have different colors.

12. The light emitting device of claim 1, further comprising a pixel defining layer, wherein the first composite layer or the second composite layer is disposed in an aperture of the pixel defining layer, and the first composite layer or the second composite layer covers at least a part of a side surface of the pixel defining layer and a portion of a top surface of the pixel defining layer.

13. The light emitting device of claim 1, further comprising a pixel defining layer and a spacer formed on the pixel defining layer, wherein the spacer is not overlapped with an aperture of the pixel defining layer.

14. The light emitting device of claim 1, wherein an area of the first light emitting unit is different from an area of the second light emitting unit.

15. The light emitting device of claim 1, wherein the first composite layer and the second composite layer respectively comprise an electron injection layer or an electron transporting layer, and the electron injection layer of the first composite layer and the electron injection layer of the second composite layer are separated, or the electron transporting layer of the first composite layer and the electron transporting layer of the second composite layer are separated,
wherein the first composite layer and the second composite layer respectively comprise a hole injection layer or a hole transporting layer, and the hole injection layer of the first composite layer and the hole injection layer of the second composite layer are separated, or the hole transporting layer of the first composite layer and the hole transporting layer of the second composite layer are separated.

16. A light emitting device, comprising:
a first light emitting unit comprising a first composite layer, and the first composite layer comprising an organic light emitting layer;
a second light emitting unit adjacent to the first light emitting unit, the second light emitting unit comprising a second composite layer, and the second composite layer comprising a quantum dot light emitting layer;
a pixel defining layer; and
a spacer disposed on the pixel defining layer and having a curved profile,
wherein a thickness of the organic light emitting layer is less than a thickness of the quantum dot light emitting layer.

17. The light emitting device of claim 16, wherein a ratio of the thickness of the organic light emitting layer to the thickness of the quantum dot light emitting layer is greater than or equal to 0.1 and less than 1.

* * * * *